US011543466B2

(12) United States Patent
Chen et al.

(10) Patent No.: US 11,543,466 B2
(45) Date of Patent: Jan. 3, 2023

(54) MAGNETIC SENSOR COMPONENT AND ASSEMBLY

(71) Applicant: Melexis Technologies SA, Bevaix (CH)

(72) Inventors: Jian Chen, Bevaix (CH); Matthijs Pardoen, Bevaix (CH); Arnaud Laville, Bevaix (CH); Orlin Gueorguiev Saradjov, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 229 days.

(21) Appl. No.: 17/030,900

(22) Filed: Sep. 24, 2020

(65) Prior Publication Data

US 2021/0018574 A1 Jan. 21, 2021

Related U.S. Application Data

(63) Continuation-in-part of application No. 16/361,973, filed on Mar. 22, 2019, now Pat. No. 11,067,645.

(30) Foreign Application Priority Data

Mar. 24, 2018 (EP) ..................................... 18163816

(51) Int. Cl.
*G01R 33/00* (2006.01)
*G01R 33/02* (2006.01)

(52) U.S. Cl.
CPC ..... *G01R 33/0047* (2013.01); *G01R 33/0052* (2013.01); *G01R 33/02* (2013.01)

(58) Field of Classification Search
CPC .............................. G01R 33/0047; G01R 33/02
See application file for complete search history.

(56) References Cited

U.S. PATENT DOCUMENTS

| 4,540,226 A | 9/1985 | Thompson et al. |
| 4,951,124 A | 8/1990 | Sawaya |

(Continued)

FOREIGN PATENT DOCUMENTS

| EP | 0508615 A1 | 10/1992 |
| JP | S64-013754 A | 1/1989 |

(Continued)

OTHER PUBLICATIONS

European Search Report from EP application No. 19163121.7, dated Aug. 13, 2019.

(Continued)

*Primary Examiner* — Reena Aurora
(74) *Attorney, Agent, or Firm* — Workman Nydegger

(57) ABSTRACT

A sensor comprises a housing; and a lead frame comprising at least three elongated leads having an exterior portion extending from the housing; and a magnetic sensor circuit disposed in the housing and connected to the lead frame. The housing comprising at least two recesses or at least two lateral protrusions arranged on two opposite sides of the housing, for allowing the sensor to be mounted to the support. A component assembly comprising said sensor mounted on a support, the support comprising a plurality of first and second posts and a plurality of electrical contacts. A method of producing said component assembly, comprising the step of arranging said sensor with its elongated leads adjacent the first posts, and arranging its lateral protrusions and/or lateral recesses adjacent the second posts, and connecting the elongated leads to the electrical contacts.

18 Claims, 29 Drawing Sheets

(56) References Cited

U.S. PATENT DOCUMENTS

| | | | |
|---|---|---|---|
| 5,643,835 | A | 7/1997 | Chia et al. |
| 5,890,281 | A | 4/1999 | Thaller et al. |
| 5,978,229 | A | 11/1999 | Kim |
| 6,476,476 | B1 | 11/2002 | Glenn |
| 7,220,135 | B1 | 5/2007 | Brekosky et al. |
| 7,880,291 | B2 | 2/2011 | Park et al. |
| 8,480,411 | B1 | 7/2013 | Ho et al. |
| 2004/0113240 | A1 | 6/2004 | Hauser et al. |
| 2005/0237760 | A1 | 10/2005 | Tsukamoto et al. |
| 2006/0192273 | A1 | 8/2006 | Lange et al. |
| 2009/0135067 | A1 | 5/2009 | Chen et al. |
| 2012/0196405 | A1 | 8/2012 | Sakamoto et al. |
| 2017/0363492 | A1* | 12/2017 | Chen ................. G01L 9/0055 |
| 2021/0305139 | A1* | 9/2021 | Chien ............... H01L 23/49575 |
| 2021/0375827 | A1* | 12/2021 | Chen .................. H01L 25/0657 |

FOREIGN PATENT DOCUMENTS

| | | | |
|---|---|---|---|
| JP | H06-132449 | A | 5/1994 |
| JP | 11-086987 | A | 3/1999 |

OTHER PUBLICATIONS

Extended European Search Report from EP Application No. 18163816. 4, dated Sep. 10, 2018.

* cited by examiner

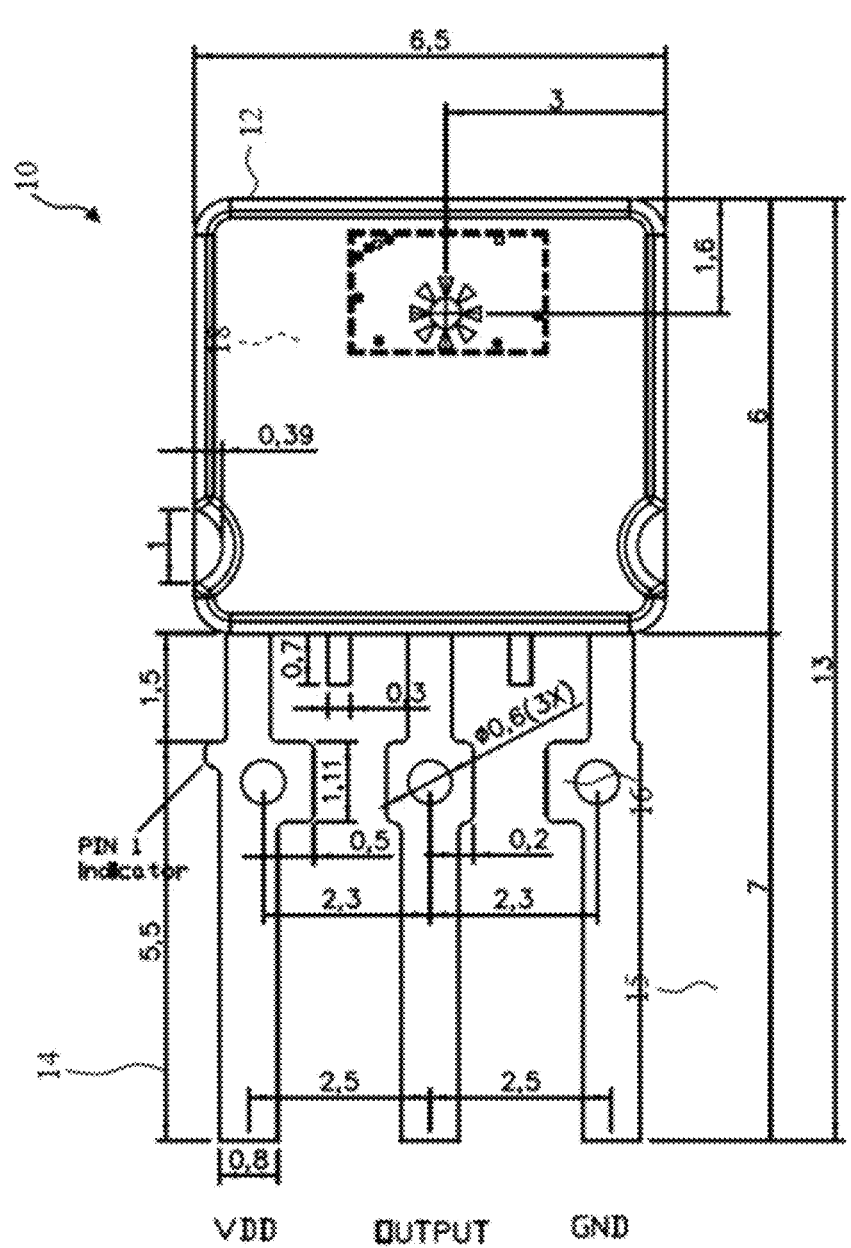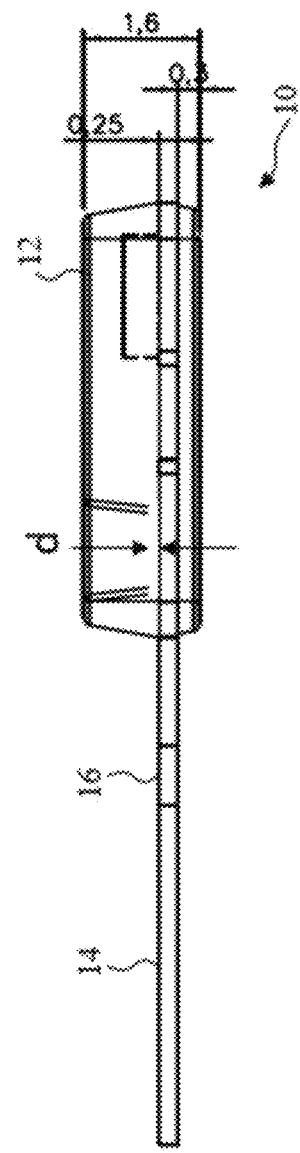
FIG. 3A
FIG. 3B

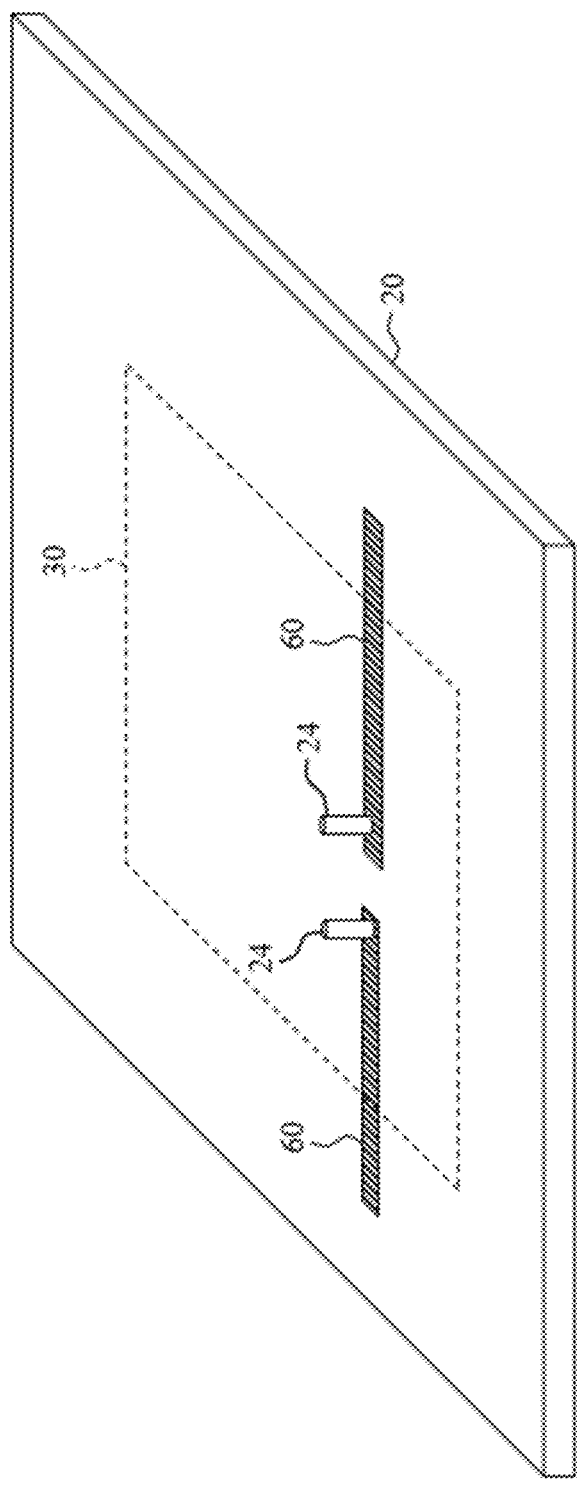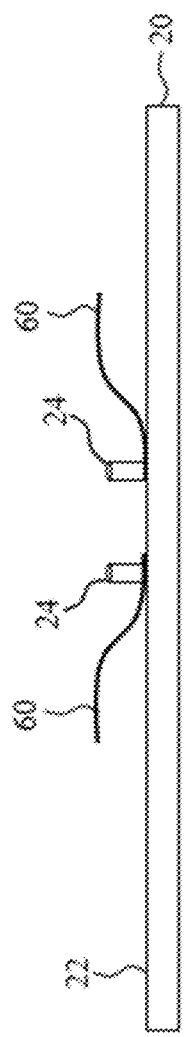
FIG. 6A
FIG. 6B

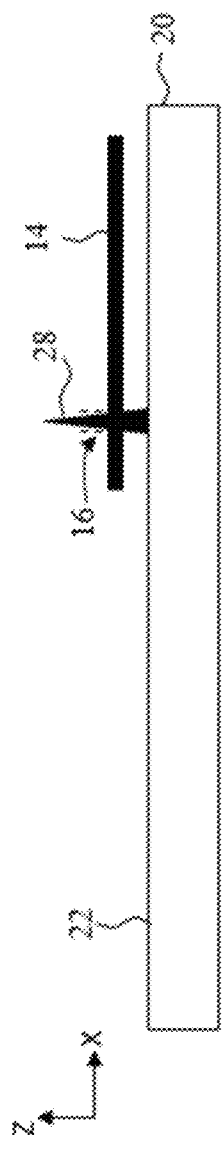
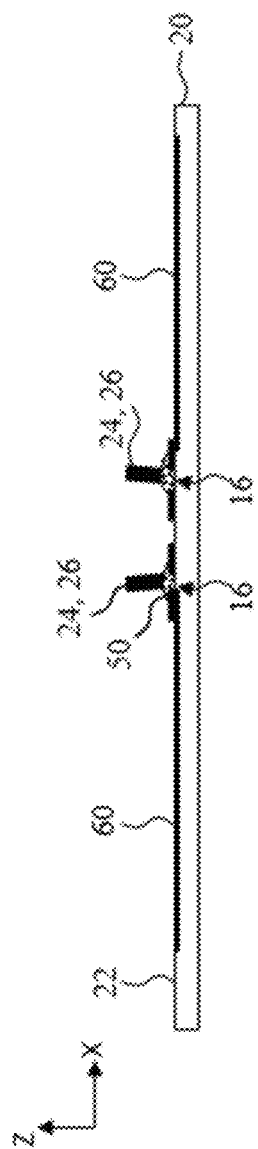
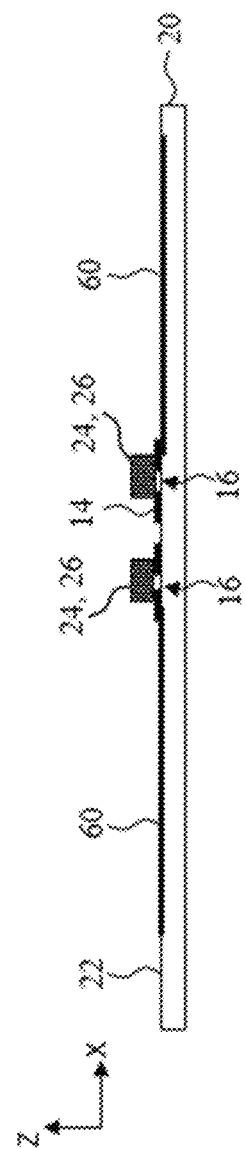

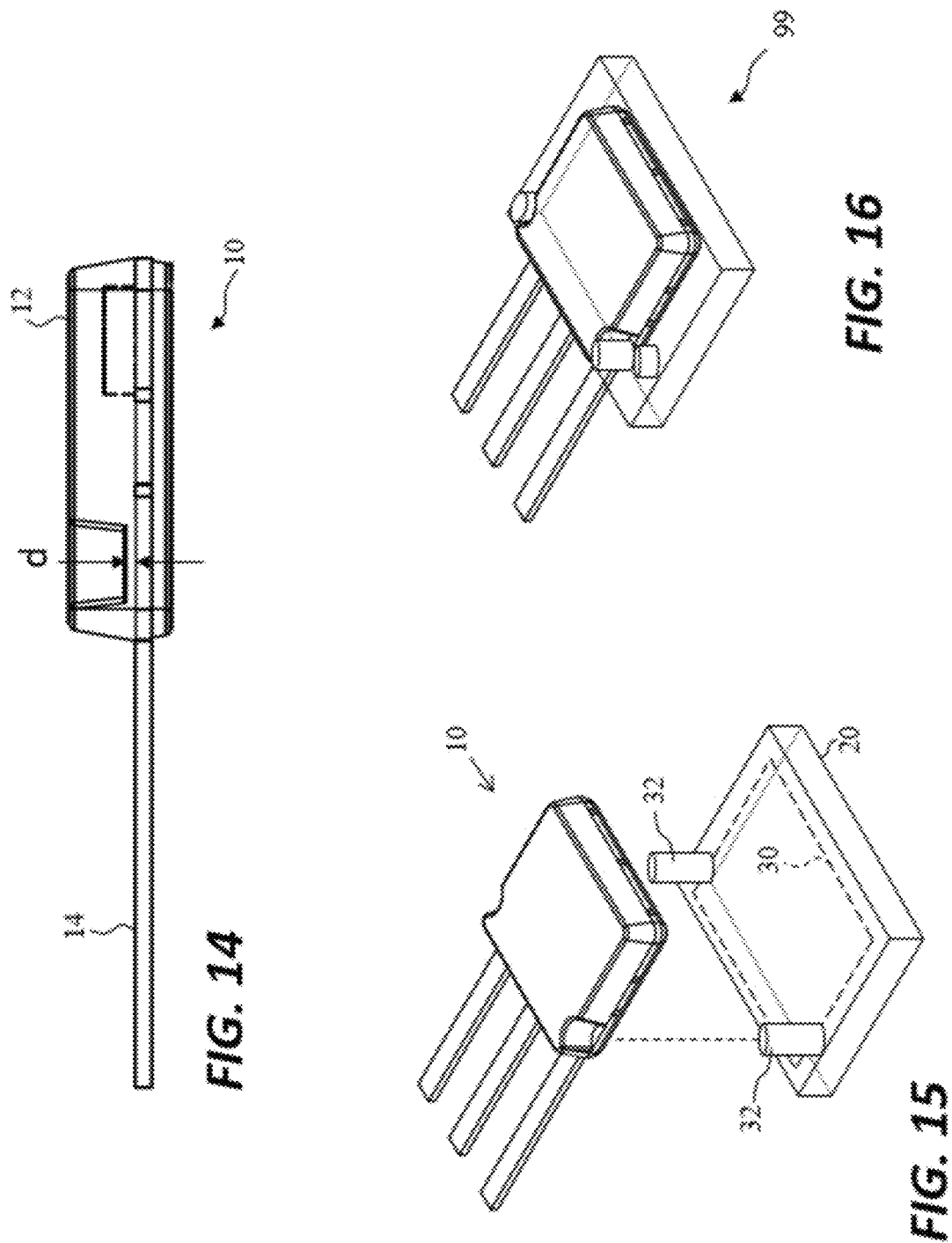

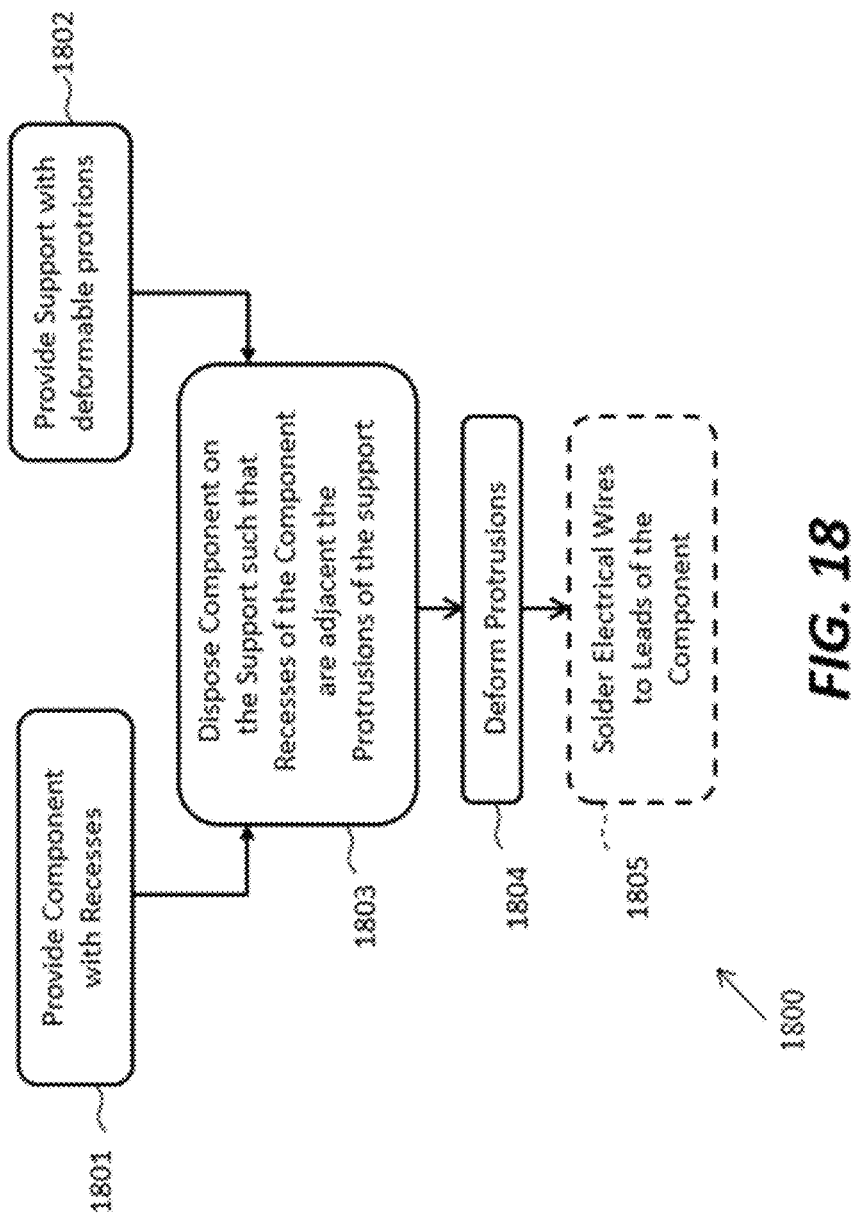

FIG 19(a)
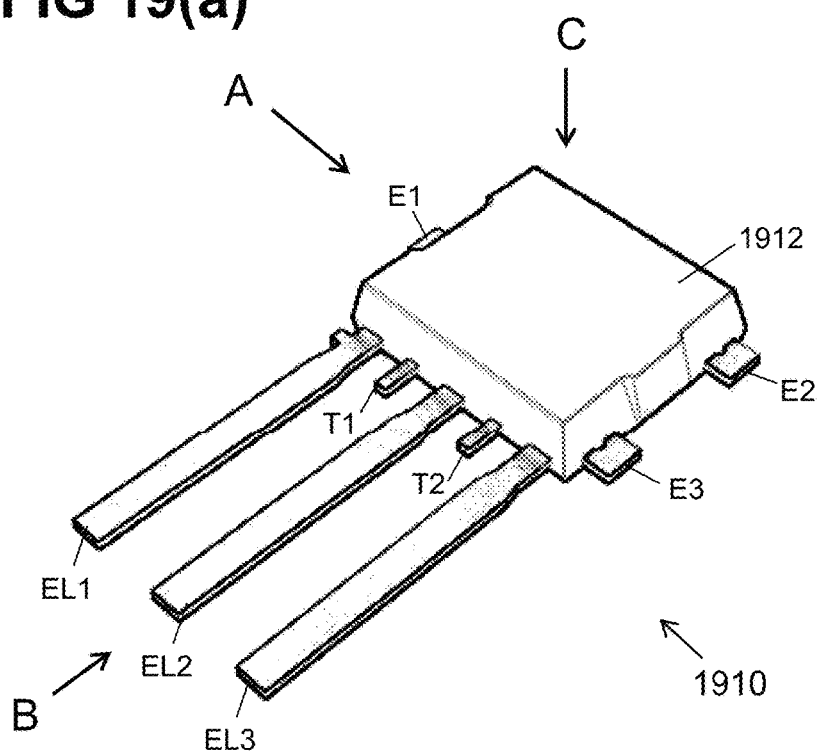
FIG 19(b)
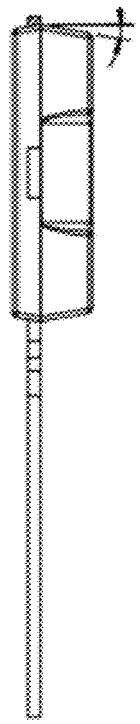
FIG 19(c)
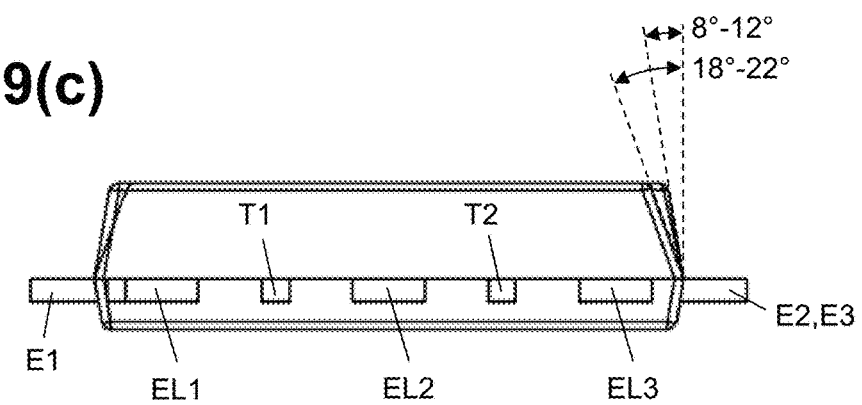
FIG 19

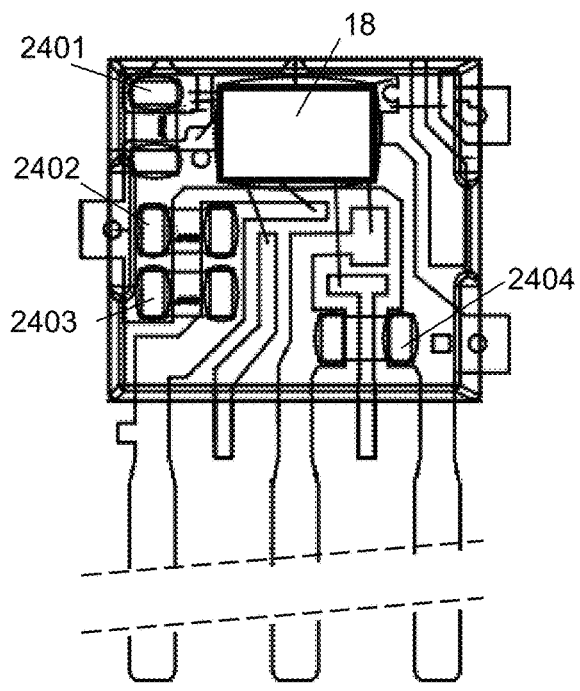
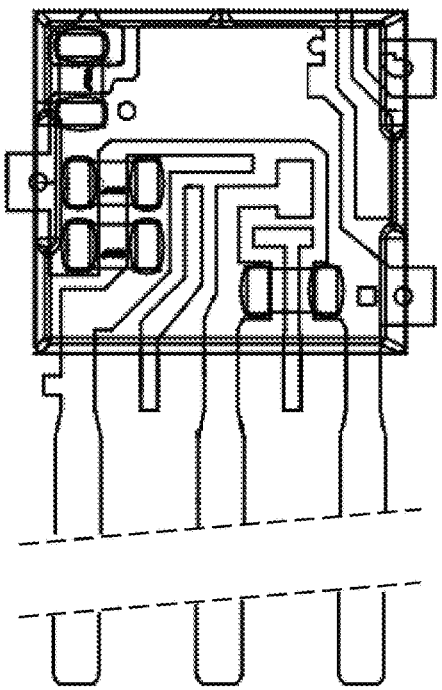
FIG 24(a)
FIG 24(b)
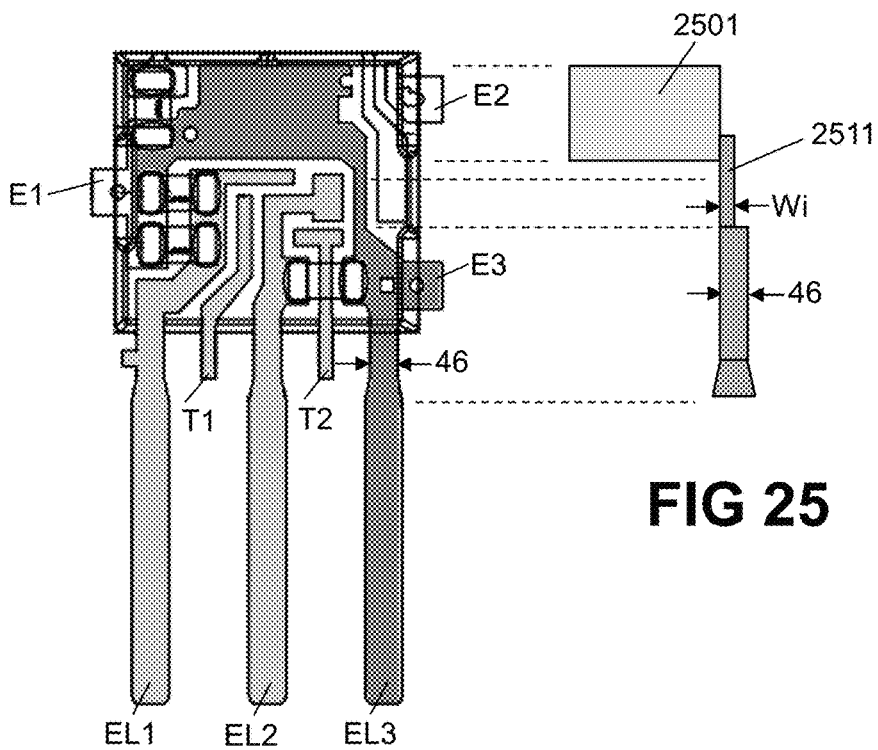
FIG 24(c)
FIG 25

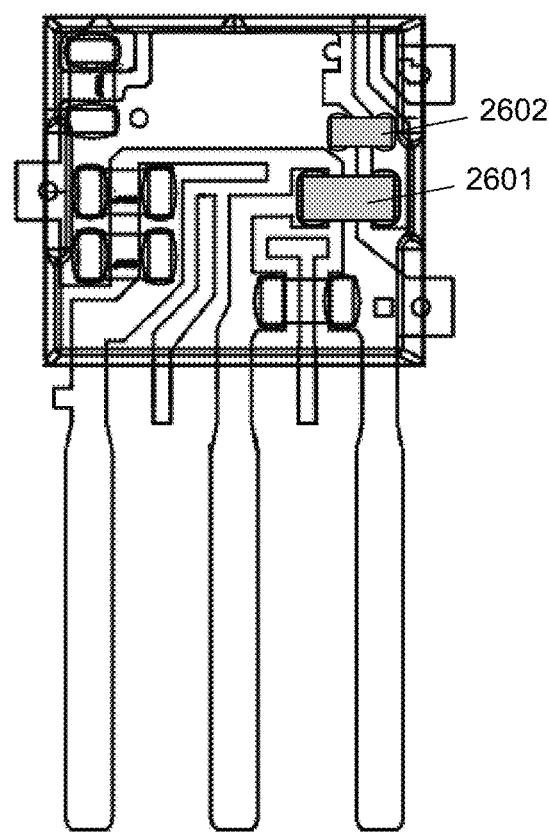
FIG 26
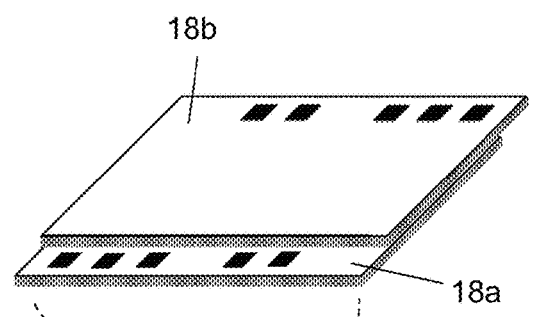
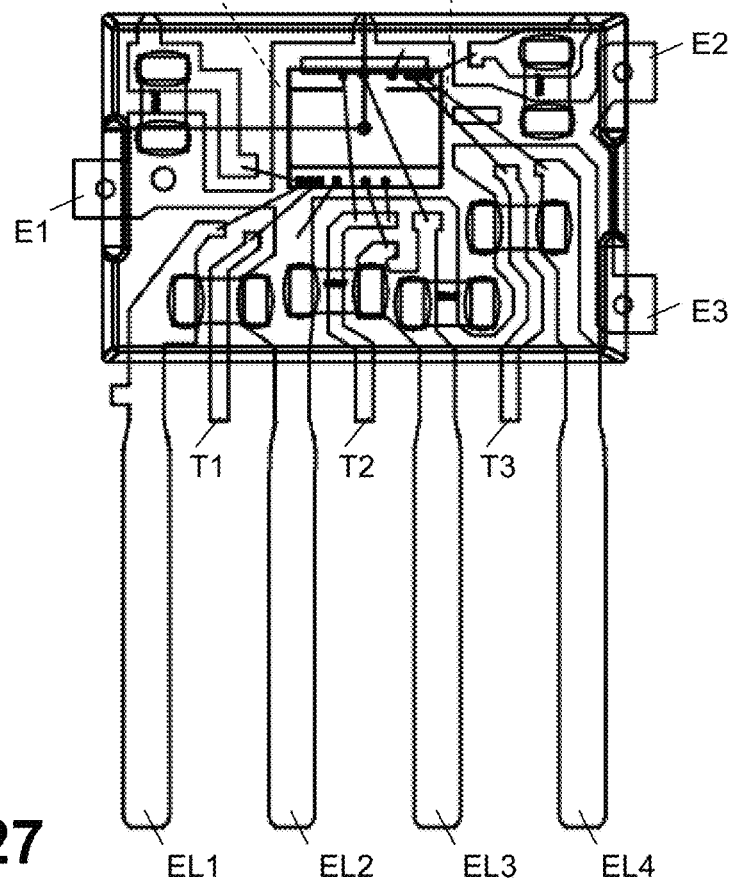
FIG 27

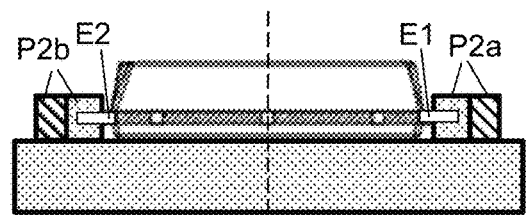
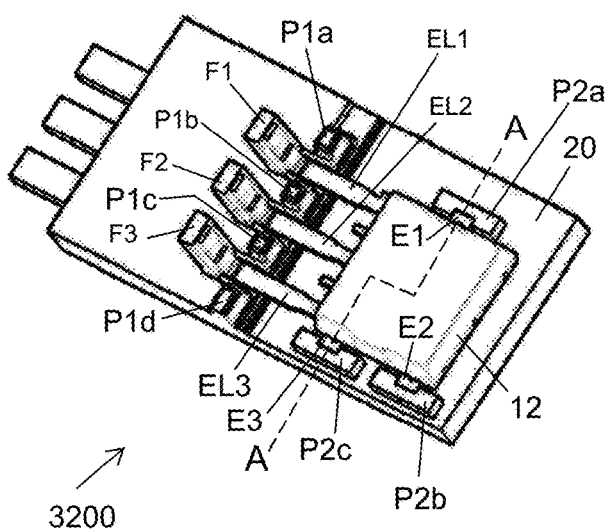
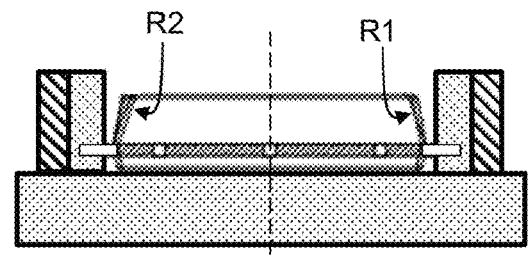
FIG 32
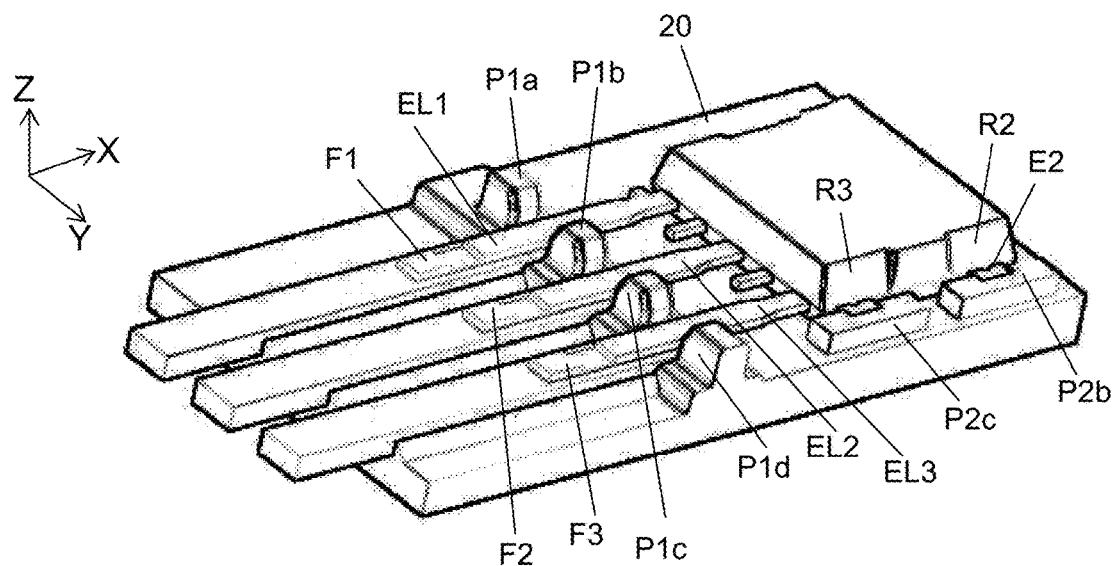
FIG 33

FIG 45(a)
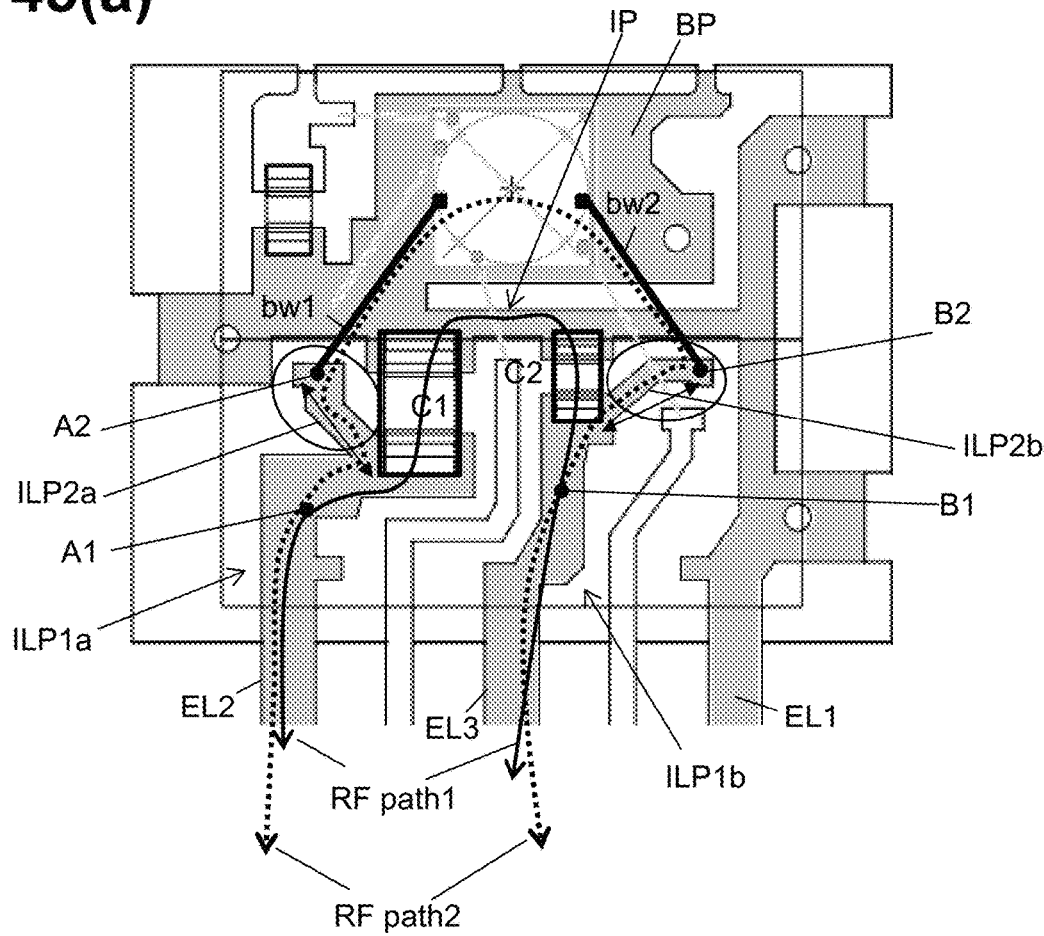
FIG 45(b)
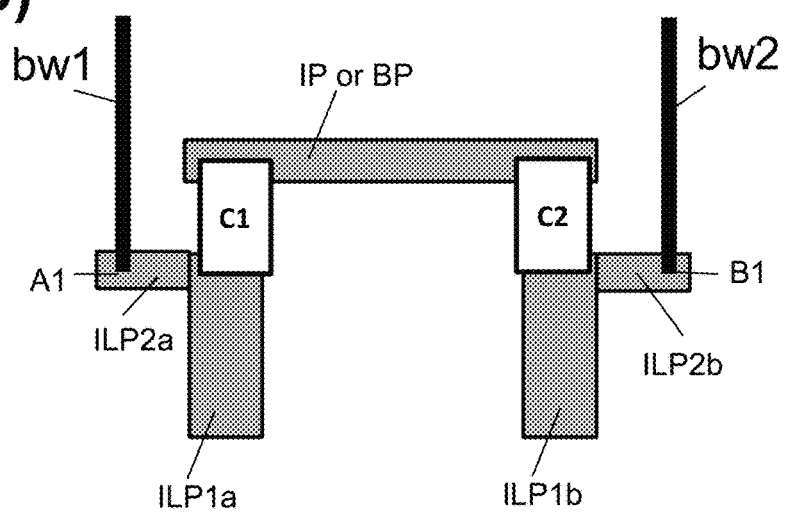
FIG 45

FIG 46(a)
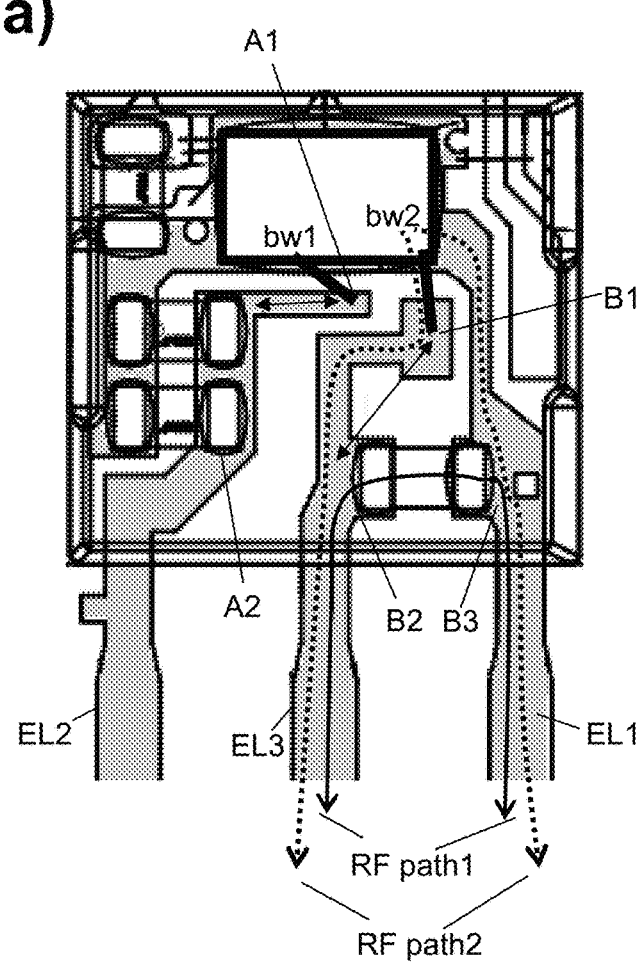
FIG 46(b)
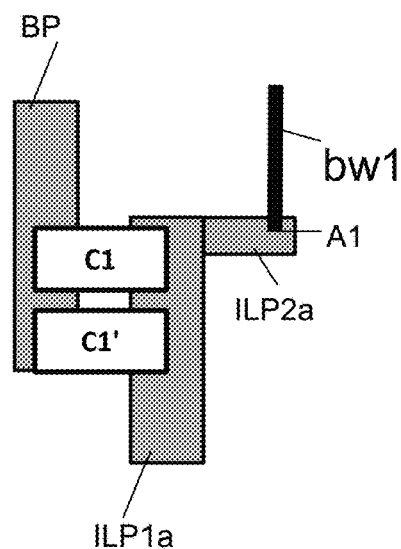
FIG 46(c)
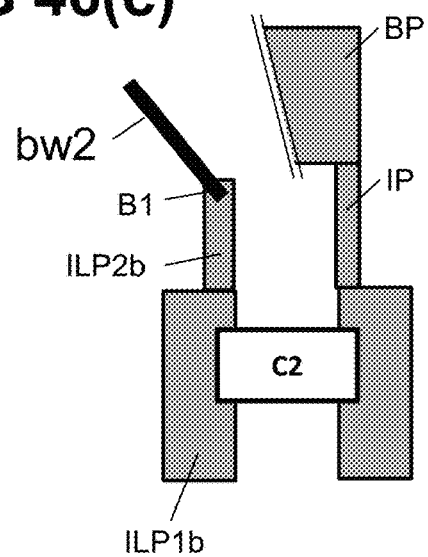
FIG 46

MAGNETIC SENSOR COMPONENT AND ASSEMBLY

FIELD OF THE INVENTION

The present invention relates to an electronic component with a magnetic sensor circuit, having provisions for accurate positioning of said component on a support.

BACKGROUND OF THE INVENTION

Sensors are widely used in electronic devices to measure attributes of the environment and report a measured signal value. In many applications, the exact location of the sensor within the sensor system is an important element of the overall sensor system.

Some conventional electronic devices assembled on printed circuit boards comprise leads (electrical connection pins) extending from a device housing. An electronic circuit, for example an integrated circuit, is disposed in the housing and conventionally adhered to a lead frame with leads extending through the housing to provide electrical connections exterior to the housing to the integrated circuit within the housing. Contacts on the integrated circuit die are electrically connected to the leads with wire bonds inside the housing. The exterior portion of the leads extending from the housing can be inserted into holes in the printed circuit board or in a socket with socket pins inserted into holes in the printed circuit board. For example, dual inline packages (DIPs) and sockets having two rows of connection pins are commonly used, as described in U.S. Pat. No. 4,540,226.

Printed circuit boards frequently include connectors soldered into holes to provide access to the devices on the printed circuit boards (see, for example U.S. Pat. No. 8,480,411). In other applications, multiple boards, for example daughter cards are sometimes stacked together, for example as disclosed in U.S. Pat. Nos. 5,890,281 and 7,220,135.

In more recent years, surface-mount packages and assembly techniques have dispensed with connection pins and simply rely on electrical connections provided on the housing and positioned on a printed circuit board. The electrical connections are subsequent soldered to circuit board contact pads to electrically connect and locate the surface-mount electronic devices on the circuit board.

One method used to locate devices with respect to a surface uses guide pins. For example, U.S. Pat. No. 5,978,229 describes guide pins positioned in the corners of a socket that mate with non-standard holes on a circuit board. A related method is used to stack and electrically connect integrated circuits. Each circuit has projecting pins on the bottom and receiving holes on the top, as disclosed in U.S. Pat. Nos. 7,880,291 and 6,476,476.

These prior-art techniques do not always provide the precision needed for locating electronic devices, such as magnetic sensors, in a two-dimensional or three-dimensional space within an electronic system. Furthermore, prior-art techniques do not always provide accurate z-axis location (orthogonal to the typical x and y dimensions defining the surface of a printed circuit board) and are not necessarily suitable for systems in which the electronic devices are not disposed on a printed circuit board.

There is a need, therefore, for alternative positioning methods and structures for electronic devices within electronic systems.

SUMMARY OF THE INVENTION

It is an aim of the present invention to provide a sensor which can be accurately positioned, and to provide a component assembly comprising said sensor, and a method of making said component assembly.

It is an aim of embodiments of the present invention to provide such a sensor which can be mounted in a manner where movements in any direction is blocked.

It is an aim of embodiments of the present invention to provide such a sensor which can be mounted in a manner where movement in any direction is blocked and which is more compact than existing solutions.

It is an aim of embodiments of the present invention to provide a sensor, which has provisions for improved testing without negatively influencing its compactness.

It is an aim of embodiments of the present invention to provide a sensor component, which has provisions for improved testing, while using standard dimensions of the leads required during normal operation, such that it can be produced and/or handled by standard tools.

It is an aim of embodiments of the present invention to provide a sensor component having a reduced sensitivity to mechanical stress, in particular mechanical stress exerted upon its elongated leads.

It is an aim of embodiments of the present invention to provide a sensor component with an improved (electro-magnetic interference) EMI behavior and/or (electro-magnetic compatibility) EMC behavior.

It is an aim of embodiments of the present invention to provide a sensor component comprising two magnetic sensor devices, configured for measuring one or more characteristics of a magnetic field at substantially the same location.

It is an aim of embodiments of the present invention to provide a sensor component comprising two magnetic sensor devices, which is highly compact, and which can be accurately positioned and oriented.

It is an aim of embodiments of the present invention to provide a component assembly comprising said sensor component being accurately positioned and fixedly mounted to a support, and to a method of accurately positioning and fixedly mounting said sensor component to a support.

It is also an embodiment of embodiments of the present invention to provide a sensor component comprising a housing, a sensor circuit, a lead frame for supporting the sensor circuit, and a plurality of elongated leads, which have an improved EMC behaviour, in particular a higher robustness against a "bulk current injection (BCI) test", as part of the Closed Loop Method according to norm or standard ISO 11452-4.

These and other objects are accomplished by a sensor, and a component assembly, and a method according to embodiments of the present invention.

In a first aspect, the present invention provides a component, more in particular, a sensor, comprising: a housing; a lead frame comprising at least three elongated leads having an exterior portion extending from the housing; a magnetic sensor circuit disposed in the housing, and connected to the lead frame; the housing comprising at least two (e.g. only two or only three) recesses arranged on two opposite sides of the housing for allowing the component to be mounted by heat-stacking.

It is an advantage of providing a housing with at least two recesses, because this allows to precisely position the component by means of these recesses (e.g. by heat staking), and at the same time to firmly clamp the component at and by means of these recesses.

It is a particular advantage of using recesses (as opposed to clamping side walls without recesses) that the risk of shifting in a direction parallel to these walls is eliminated.

The component may further comprise at least one passive electrical component (such as e.g. a capacitor and/or a resistor and/or a diode) also embedded inside the housing, preferably in the form of a surface-mount component (known as "SMD" component). This at least one passive electrical component can advantageously be used for EMI/EMC purposes. The passive electrical component may comprise an SDM capacitor having a capacity in the range from about 10 nF to 100 nF.

In certain embodiments, the lead frame is exposed only on one side, (namely at the side where the leads extend from the housing).

In other embodiments, the lead frame is exposed on at least three sides, e.g. said first side where the leads extend from the housing, and two lateral sides where protrusions (also referred to herein as "ears") extend from the housing.

In other embodiments, the lead frame is exposed on four sides, e.g. the three sides mentione above, plus a fourth side, e.g. for abutting a stop element. In an embodiment, the recesses are located at a predefined distance above the lead frame and overlap at least a portion of the lead frame surface. The predefined distance may be at least 0.2 mm, which is sufficient to guarantee that the lead frame is not exposed.

With the "recesses are overlapping at least a portion of the lead frame" is meant that a perpendicular projection of the recesses onto the plane containing the lead frame overlaps with a portion of the lead frame.

It is an advantage that the recesses are located at a predefined non-zero distance above the lead frame. This offers the advantage that such lead frame is not exposed to the environment at this location, thereby reducing the risk of corrosion or contamination of the magnetic sensor circuit and/or other components in the housing.

It is an advantage if the recesses are overlapping at least a (metallic) portion of the lead frame, because this allows to more accurately position and more firmly clamp the component (as compared to a clamping force exerted at the top of the molding package further away from the lead frame).

In an embodiment, the recesses have a shape comprising a bottom portion substantially parallel to the lead frame.

The bottom portion may be located at substantially half the height of the housing. This offers the huge advantage that (after heat stacking) movement in three dimensions is blocked, in contrast to for example recesses which extend over the full height of the component.

In an embodiment, the recesses have a frusto-conical wall portion or a cylindrical wall portion.

This may offer the advantage that the component will auto-align when exerting a downward force above the two recesses when mounting the component (e.g. by using heat staking).

In an embodiment, the housing comprises only two recesses located on two opposite sides of the component, and the lead frame is only exposed on one side of the housing, (namely at the side) where the leads extend from the housing.

This offers the advantage that less material is required, and that the component can be more compact, since the lead frame does not need to extend at the side opposite the elongated leads, and thus that the receiving zone that accommodates the component can be made smaller.

In an embodiment, the exterior portion of the elongated leads comprises a proximal portion having a first width, and a distal portion having a second width, the first width being smaller than the second width; and the lead frame further comprises a plurality of tabs or pins extending from the housing, each tab or pin being located substantially halfway between pairs of adjacent elongated leads, and having an exterior length smaller than an exterior length of the proximal portions of the elongated leads and/or having an exterior width smaller than the first width of the proximal portions of the elongated leads.

It is an advantage that the elongated leads have proximal portions (adjacent the housing) with a reduced width, because this allows to provide additional test-pins between adjacent proximal portions, while maintaining as much as possible typical or standard mechanical dimensions and/or tolerances of the lead frame and the leads.

Such tabs or pens or pins are ideal for use as test pins, e.g. to allow measurement of signals of the circuit, without needing the sizes and tolerances typically required for soldering.

It is an advantage of such component that it has a plurality of tabs or pens or pins which can be connected to the circuit and which can be used as test pins, without requiring a larger package. This offers the best of both worlds: low cost due to smaller package (than would be needed if only elongated leads were used), and improved testability.

It is an advantage of this embodiment that it provides a component with a compact package with additional contacts.

According to a second aspect, the present invention also provides a component assembly, comprising: a support having a receiving zone and at least two deformable protrusions adjacent the receiving zone; and a sensor according to the first aspect, disposed on or over the support within the receiving zone between said protrusions such that the recesses are adjacent said protrusions; and wherein the protrusions are at least partially disposed within the recesses.

It is an advantage of using deformable protrusions, because it allows the component to be fixed to the support without additional material supply (e.g. a resin). This may greatly simplify the mounting process. The protrusions may comprise or consist of a thermoplastic and/or a metal and/or a metal alloy.

In embodiments, the support is a printed circuit board.
In embodiments, the support is not a printed circuit board.
In embodiments, the support is a plastic support.
In embodiments, the support is a plastic support without conductive tracks.
In embodiments, the support is a plastic support with conductive tracks.
In embodiments, the support is a plastic support with a plurality of electrical pens.

In an embodiment, the component assembly further comprises at least one passive electrical component; said passive electrical component being comprised inside the housing of the component.

The at least one passive electrical component may be or may comprise at least one capacitor and/or at least one resistor and/or at least one diode, e.g. in the form of an SMD component, e.g. having a size of about 0.5 mm×1.0 mm, or about 0.8 mm×1.6 mm.

Preferably the component containing the magnetic sensor circuit is the only component mounted on the support, and all passive electrical components (if present) which would normally be mounted on a PCB, e.g. for stabilizing the supply voltage, are now integrated inside said component housing. This is a very compact solution and allows the assembly to contain a sensor and passive components, however without requiring that these passive components are mounted and electrically interconnected on the support.

According to a third aspect, the present invention also provides a method of producing a component assembly, comprising the steps of: a) providing a sensor according to the first aspect; b) providing a support having a receiving zone and at least two deformable protrusions adjacent the receiving zone; and c) disposing the sensor on or over the support within the receiving zone between said protrusions such that the recesses are adjacent said protrusions; and d) deforming the protrusions such that the protrusions are at least partially disposed within the recesses, thereby aligning and clamping the sensor.

It is an advantage that the protrusions and the corresponding (or mating) recesses provide both an aligning function and a fixation function.

According to a fourth aspect, the present invention also provides a sensor, optionally but not necessarily having the features of a sensor according to the first aspect, the sensor comprising: a housing; a circuit disposed in the housing; a lead frame comprising at least a first elongated lead, and a second elongated lead substantially parallel to the first elongated lead, each of the first and second elongated lead having an exterior portion extending from the housing; the first elongated lead comprising a first alignment hole, and the second elongated lead comprising a second alignment hole, each alignment hole configured to receive a respective positioning pin.

It is an advantage of such component that it can be precisely positioned and/or firmly connected to for example a printed circuit board, by means of the alignment holes.

It is an advantage of such component that the alignment holes can also be used for load bearing purposes, for example when the component is mounted on a printed circuit board subject to vibrations. In this way, the risk that the component moves or shifts over time, or that the soldering of the leads breaks, is substantially eliminated.

It is an advantage that the alignment holes are provided in the leads, because in this way standard package dimensions and tooling (e.g. for producing the package and/or for pick and placement) can be used, or they require only minimal changes.

In an embodiment, the exterior portion of each of the first and second elongated lead comprises a proximal portion having a first width, and a distal portion having a second width larger than the first width, and a central portion having a third width larger than the first width; and wherein the central portion of the first elongated lead comprises the first alignment hole, and the central portion of the second elongated lead comprises the second alignment hole.

The width of the central portion may be smaller than, equal to, or larger than the second width.

It is an advantage of providing the alignment holes in the central portion, because this portion is closer to the housing than the distal portions (which are typically soldered), thus mounting tolerances can be improved.

It is an advantage that the elongated leads have three different widths, because it allows to provide both alignment holes in the elongated leads proper, and allows to provide additional test-pins between two adjacent proximal portions, while maintaining the mechanical tolerances of the lead frame.

In an embodiment, the lead frame further comprises a plurality of tabs extending from the housing, each tab located substantially halfway between pairs of adjacent elongated leads.

Such tabs are ideal for use as test pins, to allow measurement of signals of the circuit, without needing the sizes and tolerances typically required for guaranteed soldering.

It is an advantage of such component that it has a plurality of tabs which can be connected to the circuit and which can be used as test pins, without requiring a larger package. This offers the best of both worlds: low cost due to smaller package (than would be needed if only elongated leads were used), and improved testability.

It is an advantage of this embodiment that it provides a component with a compact package with additional contacts.

Preferably each tab has a width smaller than the first width of the proximal portion of the elongated leads, and smaller than the second width of the distal portion of the elongated leads.

Preferably, each tab has an exterior length smaller than an exterior length of the proximal portions.

With "exterior length" is meant the length of the portion exterior to the housing.

In the example of FIG. 3A, the exterior length of the proximal portions is equal to about 1.5 mm, and the exterior length of the tabs is equal to about 0.7 mm.

In an embodiment, the lead frame comprises only three elongated leads and only one or only two tabs.

In an embodiment, the lead frame comprises only five elongated leads and only one or only two or only three or only four tabs.

In an embodiment, the exterior length of the tabs is smaller than 1.0 mm.

In an embodiment, the width of the tabs is a value in the range from 0.2 to 0.4 mm.

It is an advantage of such tabs that they occupy only minimal space, and thus allow sufficient distance from the leads, which is good for EMI and EMC. This also reduces the risk of making a short circuit between the tab and the adjacent elongated lead when measuring a signal on the tab using for example a probe of an oscilloscope.

The distance between center lines of proximal portions of adjacent elongated leads may be equal to about 2.5 mm, and/or a distance between center lines of distal portions of adjacent leads may be equal to about 2.5 mm, and/or a distance between centers of adjacent alignment holes may be equal to about 2.3 mm.

The first width (46) of the proximal portions may be a value in the range from 0.5 mm to 0.7 mm.

The third width (44) of the central portions may be a value in the range from 1.1 to 1.3 mm.

The first width 46 of the proximal portion may be equal to about 0.6 mm.

The second width 42 of the distal portion may be equal to about 0.8 mm.

The third width 44 of the central portion may be equal to about 1.2 mm.

In an embodiment, each of the first and second elongated leads is electrically connected to the circuit.

In an embodiment, at least one of said tabs or pens or pins is electrically connected to the circuit.

In an embodiment, each of said tabs is electrically connected to the circuit.

In an embodiment, each of said first and second elongated leads further comprise at least two alignment protrusions extending transversely from said leads.

This may further improve positioning accuracy. These protrusions may engage with mating recesses or openings in a printed circuit board, for example.

The two alignment protrusions preferably extend transversely from the central portion of the respective elongated leads.

In an embodiment, the circuit comprises at least one discrete passive component.

In an embodiment, the circuit comprises a magnetic sensor circuit.

According to a fifth aspect, the present invention also provides a component assembly, comprising: a support having a receiving zone, and at least a first and a second positioning pin disposed on and protruding from the support in the receiving zone; and a sensor according to the fourth aspect, disposed on or over the support within the receiving zone, wherein the first positioning pin is disposed within the first alignment hole, and the second positioning pin is disposed within the second alignment hole.

It is an advantage of using deformable protrusions because it allows the component to be fixed to the support without additional material supply (e.g. resin).

The protrusions may comprise or consist of a thermoplastic and/or a metal and/or a metal alloy.

In embodiments, the support is not a printed circuit board.

In embodiments, the support is a plastic support.

In embodiments, the support is a plastic support without conductive tracks.

In an embodiment, a portion of the positioning pin is disposed over a portion of the elongated lead adjacent the alignment hole.

The positioning pin may for example be bend or otherwise deformed.

According to a sixth aspect, the present invention also provides a method of making a component assembly, comprising the steps: providing a sensor according to the fourth aspect; providing a support with a receiving zone and a first and a second positioning pin disposed on and protruding from the support in the receiving zone; and disposing the sensor on or over the support with the first positioning pin located within the first alignment hole of the sensor component, and with the second positioning pin located within the second alignment hole of the component.

In an embodiment, the method comprises: bending or deforming one or both of the first and second positioning pin so that at least a portion of the positioning pin is located over a portion of the elongated lead adjacent the alignment hole.

According to a seventh aspect, the present invention also provides a sensor component, optionally but not necessarily having some or all of the features of a sensor according to the first aspect or the fourth aspect, the sensor comprising: a housing; a lead frame comprising at least three elongated leads having an exterior portion extending from the housing; at least one magnetic sensor circuit disposed in the housing, and connected to the lead frame; the housing comprising at least two lateral recesses arranged on two opposite sides of the housing and/or at least two lateral protrusions arranged on two opposite sides of the housing, for allowing the sensor to be mounted by heat-staking.

In an embodiment, the sensor comprises at least three lateral recesses, one located on a first lateral side, and two located on a second lateral side, the second lateral side being opposite the first lateral side.

In an embodiment, the sensor comprises at least three lateral protrusions, one located on a first lateral side, and two located on a second lateral side, the second lateral side being opposite the first lateral side.

In an embodiment, the sensor comprises at least two, or at least three lateral recesses and an equal amount of lateral protrusions, each of said protrusions being aligned with one of said recesses.

In an embodiment, the sensor comprises a first lateral side, and a second lateral side opposite the first lateral side; and the sensor comprises at least three lateral recesses, including a first, a second and a third lateral recess; and the sensor comprises at least three lateral protrusions, including a first, a second and a third lateral protrusion; and the first lateral recess and the first lateral protrusion are arranged substantially in the middle of the first lateral side; and the second lateral recess and the second lateral protrusion are arranged near a first end of the second lateral side; and the third lateral recess and the third lateral protrusion are arranged near a second end of the second lateral side, opposite the first end.

In an embodiment, the sensor further comprises a second magnetic sensor circuit; and the sensor comprises at least four elongated leads having an exterior portion extending from the housing; and the first magnetic sensor circuit is electrically connected to a first subset of said at least four elongated leads, and the second magnetic sensor circuit is electrically connected to a second subset of said at least four elongated leads, the second subset being different from the first subset.

In an embodiment, the first magnetic sensor circuit comprises a first magnetic sensor, and the second magnetic sensor circuit comprises a second magnetic sensor; and the second magnetic sensor circuit is arranged above or on top of the first magnetic sensor circuit, and is rotated with respect to the first magnetic sensor circuit such that a position of the first magnetic sensor substantially coincides with a position of the second magnetic sensor circuit.

In an embodiment, the second magnetic sensor circuit is furthermore shifted with respect to the first magnetic sensor circuit.

In an embodiment, the lead frame contains a first portion supporting the magnetic sensor circuit; and one of said at least three elongated leads is integrally formed with the first portion of the lead frame; and the lead frame is shaped such that the exterior portion of this one lead is connected to the first portion of the lead frame by means of an interconnection portion.

The "first portion" of the lead frame may be defined herein as the largest rectangle that entirely fits on the lead frame. With "largest rectangle" is meant the rectangle having the largest area.

In an embodiment, the interconnection portion has a width smaller than a width of the exterior portion of this one lead.

In an embodiment, the first portion of the lead frame is defined as a largest rectangle that entirely fits on the lead frame, and this rectangular portion has a first length and a first width, and the interconnection portion has a width smaller than the smallest of said first length and said first width, e.g. smaller than 60%, or smaller than 50%, or smaller than 40%, or smaller than 30% thereof.

In an embodiment, the interconnection portion has a width smaller than a narrowest width of the first interior portion of this one lead.

In an embodiment, the interconnection portion has a width in the range from 0.2 to 0.4 mm, e.g. equal to about 0.3 mm.

In an embodiment, the interconnection portion and an internal portion of said one lead form an L-shape or a T-shape.

In an embodiment, at least one of the other elongated leads of the at least three elongated leads are each connected to said first portion of the lead frame by means of at least one discrete passive component.

In an embodiment, each of the other elongated leads is connected to said first portion of the lead frame by means of at least one corresponding discrete passive component.

According to an eighth aspect, the present invention also provides a component assembly, optionally but not necessarily having some or all of the features of a component assembly according to the second aspect or the fifth aspect, the component assembly comprising: a sensor according to the seventh aspect; a support having a receiving zone, and a plurality of at least two first posts, and a plurality of electrical contacts; wherein the sensor is disposed on or over the support within the receiving zone such that at least one of the elongated leads is arranged adjacent one or more of the first posts; and wherein the elongated leads are electrically connected to the electrical connections of the support.

In an embodiment, the component assembly further comprises a plurality of at least two second posts; and the sensor is disposed on or over the support within the receiving zone such that at least one of the lateral recesses and/or at least one of the lateral protrusions is arranged adjacent one or more of the second posts.

In a variant, the present invention provides a component assembly, optionally but not necessarily having some or all of the features of a component assembly according to the second aspect or the fifth aspect, the component assembly comprising: a sensor according to the seventh aspect; a support having a receiving zone, and a plurality of at least two second posts, and a plurality of electrical contacts; wherein the sensor is disposed on or over the support within the receiving zone such that at least one of the lateral recesses and/or at least one of the lateral protrusions is arranged adjacent one or more of the second posts.

In an embodiment, at least one of the second posts has a U-shaped cross-section for accommodating at least one of the lateral protrusions.

In an embodiment, at least one of the plurality of first posts is deformed so as to clamp at least one of the elongated leads and/or at least one of the tabs of the sensor to the support.

In an embodiment, at least one of the plurality of second posts is deformed so as to clamp the sensor to the support by means of at least one of its lateral recesses and/or by means of at least one of its lateral protrusions.

According to a ninth aspect, the present invention also provides a method of producing the component assembly of the eighth aspect, optionally but not necessarily having some or all of the features of a method according to the third aspect or the sixth aspect, the method comprising the steps of: a) providing a sensor according to the seventh aspect; b) providing a support comprising a receiving zone, and a plurality of first posts, and a plurality of second posts, and a plurality of electrical contacts; c) disposing the sensor on the support with at least one of its elongated leads adjacent at least one of the first posts; d) electrically connecting the elongated leads of the sensor and the electrical contacts of the support.

In a variant, the present invention provides a method of producing the component assembly of the eighth aspect, optionally but not necessarily having some or all of the features of a method according to the third aspect or the sixth aspect, the method comprising the steps of: a) providing a sensor according to the seventh aspect; b) providing a support comprising a receiving zone, and a plurality of second posts, and a plurality of electrical contacts; c) disposing the sensor on the support with at least one of its lateral recesses and/or at least one of its lateral protrusions adjacent at least one of the second posts; d) electrically connecting the elongated leads of the sensor and the electrical contacts of the support.

In an embodiment, step b) comprises providing b) providing a support comprising a receiving zone, and a plurality of first posts and a plurality of second posts, and a plurality of electrical contacts; and step c) comprises: c) disposing the sensor on the support with at least one of its elongated leads adjacent at least one of the first posts, and with at least one of its lateral recesses and/or at least one of its lateral protrusions adjacent at least one of the second posts.

In an embodiment, the method further comprises the step of: e) deforming at least one of the first posts and/or at least one of the second posts, e.g. by heat-staking.

According to a tenth aspect, the present invention provides a sensor component, optionally but not necessarily having some or all of the features of a sensor according to the first, fourth or seventh aspect, the sensor comprising: a housing; a lead frame comprising at least three elongated leads, each having a respective exterior portion extending from the housing; a magnetic sensor circuit disposed in the housing, and connected to the lead frame; wherein the lead frame contains a first portion supporting the magnetic sensor circuit; and wherein at least one of said at least three elongated leads is integrally formed with the first portion of the lead frame; and wherein the lead frame is shaped such that the exterior portion of this one lead is connected to the first portion of the lead frame by means of an interconnection portion having a width smaller than a width of the exterior portion of this one lead.

In an embodiment, the interconnection portion and an internal portion of said one lead form an L-shape or a T-shape.

In an embodiment, the other elongated leads (i.e. other than the first elongated lead which is integrally formed with the body portion) of the at least three elongated leads are each connected to said first portion of the lead frame by means of at least one discrete passive component.

In an embodiment, the sensor further comprises a second magnetic sensor circuit; and the sensor comprises at least four elongated leads having an exterior portion extending from the housing; and the first magnetic sensor circuit is electrically connected to a first subset of said at least four elongated leads, and the second magnetic sensor circuit is electrically connected to a second subset of said at least four elongated leads, the second subset being different from the first subset.

In an embodiment, the first magnetic sensor circuit comprises a first magnetic sensor, and the second magnetic sensor circuit comprises a second magnetic sensor; and the second magnetic sensor circuit is arranged above or on top of the first magnetic sensor circuit, and is rotated with respect to the first magnetic sensor circuit such that a position of the first magnetic sensor substantially coincides with a position of the second magnetic sensor circuit.

In an embodiment, the second magnetic sensor circuit is furthermore shifted with respect to the first magnetic sensor circuit.

According to an eleventh aspect, the present invention provides a sensor component, optionally but not necessarily having some or all of the features of a sensor according to the first, fourth, seventh or tenth aspect, the sensor comprising: a housing; at least one sensor circuit provided within the housing; a lead frame that includes a body portion supporting the sensor circuit, and comprises a plurality of elongated leads, each elongated lead having an interior portion located inside the housing, and an exterior portion that extends from the housing; wherein said plurality of elongated leads comprises a first elongated lead which is integrally formed with the body portion, and comprises a plurality of other elongated leads not integrally formed with the body portion; wherein at least one of said other elongated leads is electrically connected to the body portion of the lead frame by means of at least one discrete capacitor incorporated in the housing.

In an embodiment, each of said other elongated leads is electrically connected to the body portion of the lead frame by means of at least one respective discrete capacitor incorporated in the housing.

In an embodiment, the at least one discrete capacitor is a Surface Mount Discrete (SMD) capacitor.

In an embodiment, the first elongated lead is connected to the body portion of the lead frame by means of an interconnection portion, e.g. a relatively narrow and relatively long interconnection portion.

In an embodiment, the interconnection portion is formed by an elongated cut-out of the body portion.

In an embodiment, the elongated cut-out has a width of about 0.2 to 0.4 mm, e.g. equal to about 0.3 mm over at least a portion of its length, e.g. over a major portion of its length, e.g. over at least 60% of its length, or at least 70%, or at least 80%, or at least 90%, or over its full length.

In an embodiment, the elongated cut-out has a width and a length, and a ratio of the length to width of the elongated cut-out is at least 4, or at least 5.

In an embodiment, the interconnection portion has a width of about 0.2 to 0.4 mm, e.g. equal to about 0.3 mm over at least a portion of its length, preferably over a major portion of its length, e.g. over at least 60% of its length, or at least 70%, or at least 80%, or at least 90%, or over its full length.

In an embodiment, the interconnection portion has a length over width (L/W) ratio of at least 4 or at least 5.

In an embodiment, the interior portion of the other leads have a first interior lead portion proximal to the exterior portion having a first width; and have a second interior lead portion, distal from the exterior lead portion, having a second width, wherein the second width is smaller than the first width.

In an embodiment, the first interior portion of the leads have a width equal to or smaller than a width or a narrowest width of the exterior portion of the respective lead.

In an embodiment, the second interior portion of the elongated leads have a width smaller than the width or the narrowest width of the first interior portion.

In an embodiment, the interior portion of the other leads have a first interior lead portion proximal to the exterior portion having a first average width; and have a second interior lead portion, distal from the exterior lead portion, having a second average width, wherein the second average width is smaller than the first average width.

In an embodiment, the second interior lead portion is a projection or a protrusion of the first interior lead portion.

In an embodiment, the narrowest width of the exterior portion of the first lead is value in the range from 0.5 mm to 0.7 mm.

In an embodiment, the first interior lead portion extends mainly in a first direction, and the second interior lead portion extends mainly in a second direction, the first and second direction forming an angle in the range from 10° to 90°, or from 20° to 90°, or from 30° to 90°.

In an embodiment, the sensor component further comprises at least one bond wire, having one end connected to a bond pad of the sensor circuit, and having another end connected to the second interior lead portion, preferably to a distal end of said second interior lead portion.

In an embodiment, said at least one discrete capacitor has a first end connected to the body portion of the lead frame, or to the first interior lead portion of the first elongated lead, or to the interconnection portion, and has a second end (opposite the first end) which is connected to the first interior lead portion of the elongated lead.

In an embodiment, at least one of the first interior portions is connected to the body portion of the lead frame or to the first interior portion of the first elongated lead by means of two discrete surface mounted SMD capacitors connected in parallel, and both incorporated in the housing.

It is explicitly pointed out that features of the 1st, 4th, 7th, 10th and 11th embodiment (directed to a component or sensor component) may be combined, and that features of the 2nd, 5th and 8th embodiment (directed to a component assembly) may be combined, and that features of the 3rd, 6th and 9th embodiment (directed to a method of producing said assembly) may be combined.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1 to FIG. 10 are mainly intended to illustrate a sensor component having leads with holes.

FIG. 1 is a perspective view of illustrative embodiments of the present invention.

FIG. 2 is a top view of illustrative embodiments of the present invention corresponding to FIG. 1.

FIG. 3A is a top view, and FIG. 3B is a side view of illustrative embodiments of the present invention corresponding to FIG. 1.

FIG. 4 is a perspective view of illustrative embodiments of the present invention having a component with three leads, each lead comprising one alignment hole, disposed on a support with three corresponding positioning pins.

FIG. 5 is a perspective view of illustrative embodiments of the present invention having a component with one lead comprising two alignment holes and one lead with no alignment holes disposed on a support with two positioning pins disposed within the two alignment holes.

FIG. 6A is a perspective view according to illustrative embodiments of the present invention comprising a support with positioning pins and wires.

FIG. 6B is a schematic side view according to illustrative embodiments of the present invention comprising a support with positioning pins and electrically connecting wire cables.

FIG. 7 is a schematic side view according to illustrative embodiments of the present invention comprising positioning pins providing z-axis location.

FIG. 8 is a schematic side view according to illustrative embodiments of the present invention comprising bent positioning pins.

FIG. 9 is a schematic side view according to illustrative embodiments of the present invention comprising deformed positioning pins; and FIG. 10 is a flow diagram of illustrative methods of the present invention.

FIG. 11 to FIG. 18 are mainly related to a sensor component having a housing with recesses.

FIG. 11 is a variant of FIG. 2 and shows another exemplary component according to an embodiment of the present invention.

FIG. 12 is a variant of FIG. 3A and shows a top view of the component of FIG. 11 without the housing, for illustrative purposes.

FIG. 13 shows the component of FIG. 11 in top view.

FIG. 14 shows the component of FIG. 13 in front view.

FIG. 15 shows the component of FIG. 11 and an exemplary support comprising two protrusions for holding said component.

FIG. 16 shows a component assembly comprising the support and the component of FIG. 15, according to an embodiment of the present invention.

FIG. 17 shows the component of FIG. 11 and another exemplary support comprising two beam-shaped protrusions for holding said component.

FIG. 18 illustrates a method of producing a component assembly, according to an embodiment of the present invention.

FIG. 19 to FIG. 45 are mainly related to a sensor component having a housing with at least two (e.g. three recesses) and/or at least two (e.g. three lateral protrusions).

FIG. 19 shows another exemplary sensor component according to an embodiment of the present invention. FIG. 19(a) shows a perspective view. FIG. 19(b) shows a side view (from viewing position A). FIG. 19(c) shows a front view (from viewing position B).

FIG. 20 shows a variant of the component of FIG. 19 in top view, according to an embodiment of the present invention.

FIG. 22 shows the shape of the lead frame of FIG. 21(b), and highlights four rectangular regions thereof.

FIG. 23 is an abstract representation of the rectangular regions in FIG. 22, some of which form an L-shape or a T-shape.

FIG. 24(a) shows another example of the component having a package as illustrated in FIG. 19, showing inter alia the shape and relative position of the lead frame, portions of the elongated leads, optional test pins, bond wires, a magnetic sensor device in the form of a semiconductor device, and four integrated SMD components.

FIG. 24(b) shows the same picture as FIG. 24(a), but without the bond wires and without the magnetic sensor device.

FIG. 24(c) shows how the first (main) portion of the lead frame is integrally formed with one of the elongated leads.

FIG. 25 is an abstract representation of the first (main) lead frame portion of FIG. 24(c), and the interconnection portion, and the elongated lead.

FIG. 26 shows a variant of FIG. 24(b) having six integrated SMD components, as can be used in embodiments of the present invention.

FIG. 27 shows another component according to an embodiment of the present invention, having four elongated leads, having three (optional) tabs or test pins located between said elongated leads, having three recesses and three protrusions on the two lateral sides of the housing, and comprising two magnetic sensor devices, stacked on top of each other.

FIG. 28 and FIG. 29 show two perspective views of the component of FIG. 27, seen from the outside of the package.

FIG. 30 shows a variant of FIG. 27, also comprising two magnetic sensor devices, but mounted side by side.

FIG. 31 shows another variant of a component according to an embodiment of the present invention, comprising two magnetic sensor devices, six elongated leads, four or five optional test pins, three lateral recesses and three lateral protrusions.

FIG. 32(a) to (c) shows a component assembly according to an embodiment of the present invention, comprising a support, and a sensor component having a package as illustrated in FIG. 19 mounted on said support.

FIG. 32(a) shows the component assembly in perspective view.

FIG. 32(b) shows a cross section of the assembly according to the broken line A-A of FIG. 32(a), wherein the assembly has relatively small second posts, suitable for aligning or positioning the sensor device.

FIG. 32(c) shows a cross section of the assembly according to the broken line A-A of FIG. 32(a), wherein the assembly has relatively large second posts, suitable for heat staking the lateral protrusions of the package.

FIG. 33 is a variant of FIG. 32, wherein the elongated leads are straight (not bent), according to an embodiment of the present invention.

FIG. 34 shows a variant of FIG. 32, comprising a sensor component with four elongated leads, according to an embodiment of the present invention.

FIG. 35 shows a variant of FIG. 33, comprising a sensor component with four elongated leads, according to an embodiment of the present invention.

FIG. 36 illustrates another component assembly according to an embodiment of the present invention, in top view (upper part) and in side view (lower part), before heat staking.

FIG. 37 shows the component assembly of FIG. 36 after heat staking, according to an embodiment of the present invention.

FIG. 38 illustrates another component assembly according to an embodiment of the present invention, in top view (upper part) and in side view (lower part), before heat staking.

FIG. 39 shows the component assembly of FIG. 38 after heat staking, according to an embodiment of the present invention.

FIG. 40 illustrates another component assembly according to an embodiment of the present invention, in top view (upper part) and in side view (lower part), before heat staking.

FIG. 41 shows the component assembly of FIG. 40 after heat staking, according to an embodiment of the present invention.

FIG. 42 illustrates another component assembly according to an embodiment of the present invention, in perspective view.

FIG. 43 illustrates yet another component assembly according to an embodiment of the present invention, in perspective view.

FIG. 44 is a flow-diagram showing a method of producing a component assembly, according to an embodiment of the present invention.

FIG. 45, with FIGS. 45(a) and 45(b), and FIG. 46, with FIGS. 46(a), 46(b), and 46(c), show two examples of a sensor component comprising a housing, a sensor circuit, a lead frame for supporting the sensor circuit, and a plurality of elongated leads, which have an improved EMC behaviour, according to embodiments of the present invention.

Figure 1:
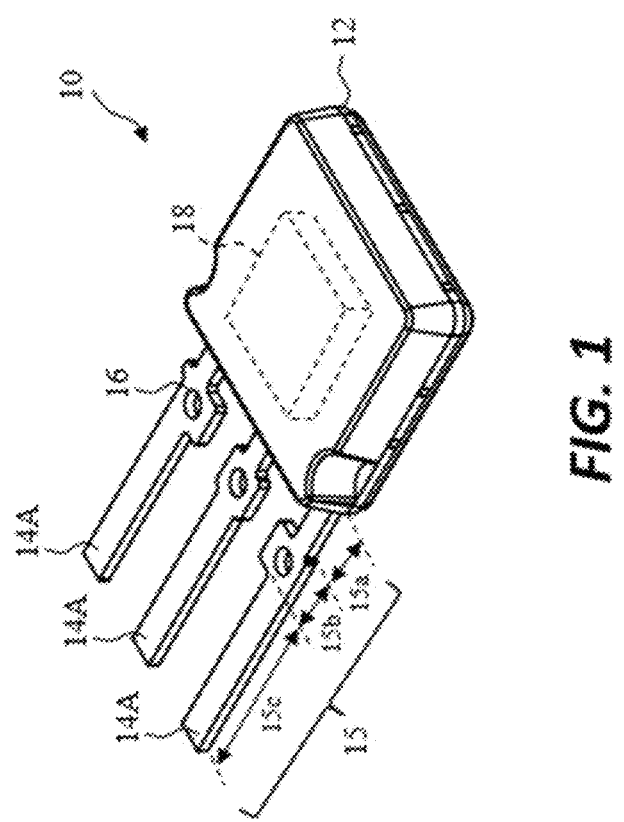

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF THE INVENTION

Electronics manufacturing processes typically pick-and-place electronic components, such as integrated circuits, onto a substrate such as a printed-circuit board (PCB) or into a test fixture. However, such placement processes have a limited positional accuracy and the actual position of the integrated circuit on the printed circuit board or in the test fixture can vary somewhat. Embodiments of the present invention can provide improved positioning of electronic devices in low-cost structures that are easy to make and adapt to a wide variety of circumstances and that provide simple electrical connections to the electronic device.

The cost of electronic components is largely determined by its package, and the choice of package is often dictated by the number of external connections. There is often a tradeoff to be made between a large package with a large number of pins, with good testability but a higher cost of the component and requiring more space, versus a smaller package with a smaller number of pins, with reduced testability, but a lower cost, and requiring less space.

Figure 2:
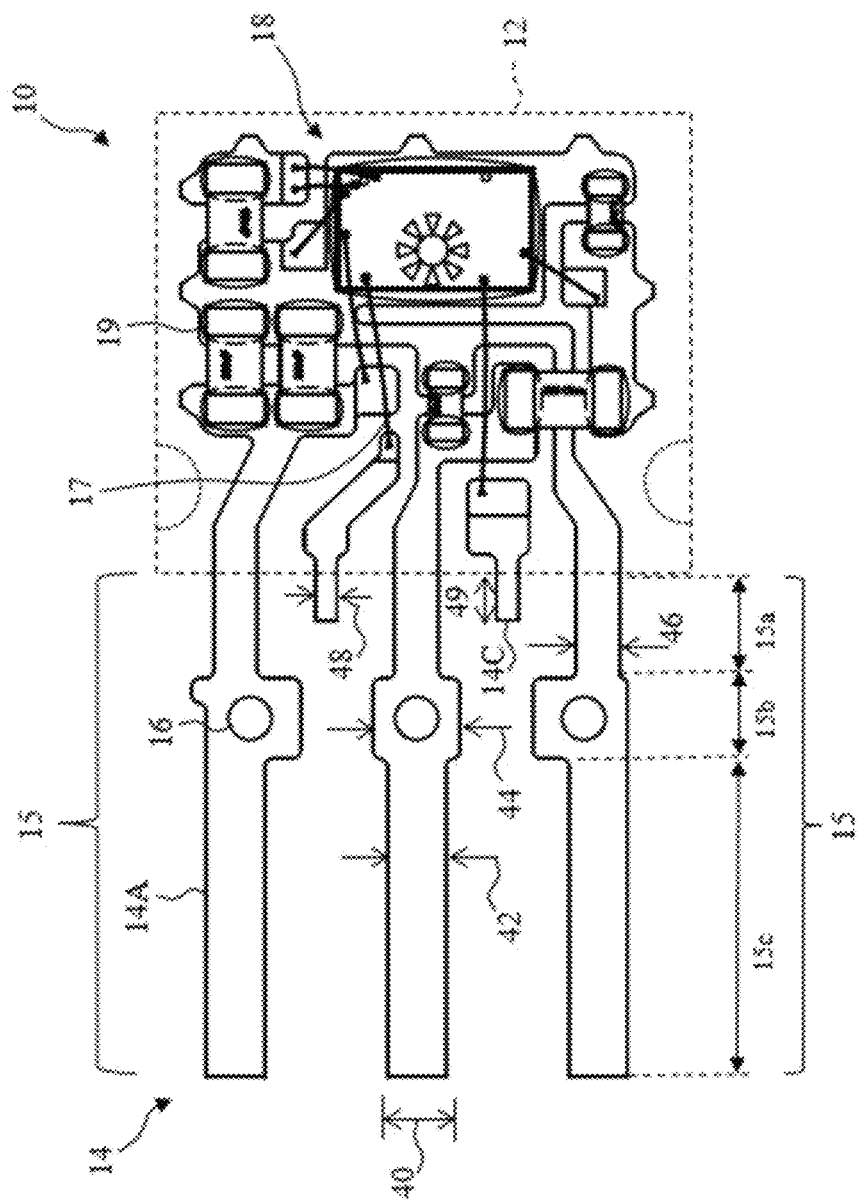

Referring to FIG. 1 in perspective view, FIG. 2 in a top view, and FIG. 3A and FIG. 3B as top and side views of a design drawing, in some embodiments of the present invention a component 10 comprises a housing 12, a circuit 18 disposed in the housing 12, one or more leads 14 each having an exterior portion 15 extending from the housing 12, and at least two alignment holes 16. Unless explicitly mentioned otherwise, the term "component" actually means a "sensor" or "sensor chip".

More in particular, the component 10 shown in FIG. 1 comprises three elongated leads 14A, including a first elongated lead with a first alignment hole, and a second elongated lead comprising a second alignment hole, and a third elongated lead comprising a third alignment hole. The elongated leads are parallel.

The alignment holes 16 are disposed in the exterior portion 15 of the leads 14A and are configured to receive a positioning pin 24 (examples of which are shown in FIG. 4 to FIG. 9).

Circuit 18 can be an electronic circuit, for example an integrated circuit, disposed in the housing 12 and electrically connected with wire bonds to an interior portion of the leads 14 located inside the housing 12. Circuit 18 can be an analog circuit, a digital circuit, or a mixed signal circuit and can include both integrated and discrete components, for example including a discrete passive component 19 such as a resistor or a capacitor or a diode (shown in FIG. 2). Circuit 18 can be a sensor such as a magnetic sensor or position sensor. The response provided by such magnetic or position sensor can be very dependent on the precise location of the sensor, and the location of the circuit 18 is important to the proper or accurate functioning of the component 10. Moreover, fixing the position of the leads 14 provides improved positioning accuracy compared to prior-art techniques of locating the housing or package of an integrated circuit, for example for a molded package or housing.

Housing 12 can serve as a body of the component 10 that may have a cavity in which a semiconductor substrate and any discrete components are disposed and electrically connected. The semiconductor substrate may comprise an integrated circuit die formed in, on, or as a part of the semiconductor substrate. The integrated circuit may comprise a plurality of magnetic sensitive elements, e.g. horizontal Hall elements, vertical Hall elements, magneto-resistive elements, etc.

The elongated leads 14A may be electrically connected to the integrated circuit die and/or to the passive component(s) 19 via wire bonds 17. Housing 12 can be, for example, a ceramic or plastic package, as is known in the integrated circuit industry.

Leads 14 are typically also referred to as "fingers" or "pins" or "connection pins" and can serve as electrical connections to the circuit 18. Leads 14 can be electrically conductive and can comprise metal or a metal alloy, for example comprising copper, aluminum, tin, silver, gold or other metals and can be formed into a variety of shapes for example by stamping or die cutting or other metal-forming methods known in the art. Similarly, alignment holes 16 in leads 14 can be formed by stamping, die cutting, molding or other known methods. Leads 14 can be coated or layered. Leads 14 can have different lengths, shapes, and may be connected to different elements of the component 10, for example to different contact pads of circuit 18.

In some embodiments of the present invention, at least two of the leads 14 (e.g. a first and a second lead) are electrically connected leads 14A, electrically connected to the circuit 18, and an alignment hole 16 is disposed in each of the at least two leads 14A. In the exemplary embodiment of FIG. 2 the component 10 has three elongated leads, and each of these three leads has an alignment hole, but that is not absolutely required. It suffices that two of the leads, preferably the two outer leads, have an alignment hole. The alignment hole in the middle lead me be omitted.

In some embodiments (see for example FIG. 4), one or more of the leads 14 are disconnected leads 14B that are not electrically connected to the circuit 18 but may also have an alignment hole 16.

Figure 5:
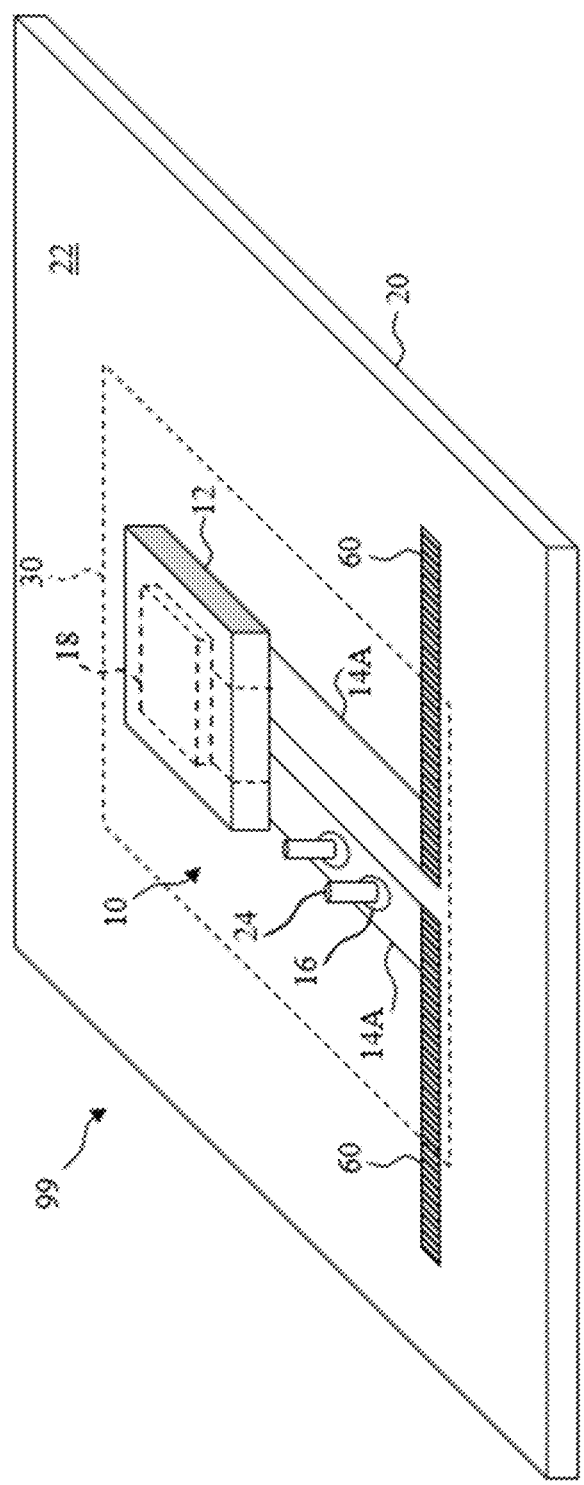

In some embodiments, a lead 14 can comprise multiple alignment holes 16. For example, FIG. 5 illustrates an embodiment in which one connected lead 14A has two alignment holes 16, and another connected lead 14A has no alignment holes 16.

In other embodiments, a component 10 can have any combination of connected or disconnected leads 14A, 14B each with no alignment holes 16, one alignment hole 16, or two or more alignment holes 16.

The embodiment of FIG. 2 illustrates a component with three connected leads 14A each with one alignment hole 16.

In various embodiments of the present invention and referring to FIG. 1 and FIG. 2, the elongated leads 14 may have multiple portions with different widths. For example, a proximal portion 15a having a first width 46, and a distal portion 15c having a second width 42, and a central portion 15b having a third width 44. In preferred embodiments, the width 46 of the proximal portion is smaller than the width 42 of the distal portion, and the width 46 of the proximal portion is smaller than the width 44 of the central portion. This makes it possible to simultaneously obtain the following advantages: (i) to provide leads having distal portions 15*c* with a standard spacing (e.g. about 2.5 mm between their center lines); and (ii) to provide central portions 15*b* with alignment holes 16; and (iii) to provide tabs 14C (also referred to herein as "second leads" or "test pins" or simply as "pins") for use as test pins; and (iv) without requiring a package with more elongated leads, and without having to use non-standard dimensions between the leads, as the latter may have a negative impact on the connectability of these leads using standard equipment.

According to some embodiments of the present invention, an exterior portion 15 of a lead 14 has an average width 40 and the width 44 of the central portion 15*b* of the lead 14 at the location of the alignment hole 16 is greater than the average width 40.

In some embodiments, the width 46 of the proximal portion 15*a* of the lead 14 adjacent to the housing 12 is less than the average width 40. By decreasing the first width 46 of the proximal portion, space can be provided for additional connections (i.e. the tabs 14C), and by increasing the width of the central portion 15*b* of the lead 14 at the location of the alignment hole 16, a robust mechanical structure can be provided.

The housing of the component 10 shown in FIG. 1 and FIG. 2 also comprises two recesses 13, but these are not mandatory in the embodiments shown in FIG. 1 to FIG. 10. In contrast, the embodiments of FIG. 11 to FIG. 18 are related to the recesses 13 but do not absolutely require leads with positioning holes 16. Also, in the embodiments of FIG. 19 to FIG. 43 it is not required that the leads contain positioning holes, although they may.

As shown in FIG. 2 and FIG. 3, the tabs (also referred to herein as "test pins" or "pens" or "pins" or "short leads") 14C have a fourth width 48 smaller than each of the first width 46, the second width 42, and the third width 44. The short leads or tabs 14C do not have alignment holes 16. The short leads 14C may provide test connections for the component 10 without increasing the size of the component 10 or the spacing of the leads 14, in particular of the distal portions 15*c* thereof.

In the embodiment shown in FIG. 1 to FIG. 3, the package has only three elongated leads 14A and only two tabs 14C located between said leads, but the present invention is not limited hereto, and packages with more than three leads, e.g. with only five elongated leads and four tabs located in between the leads, or packages with only four elongated leads (see e.g. FIG. 30) with or without tabs in between, or packages with only six elongated leads (see e.g. FIG. 31) with or without tabs in between, are also envisioned.

Figure 4:
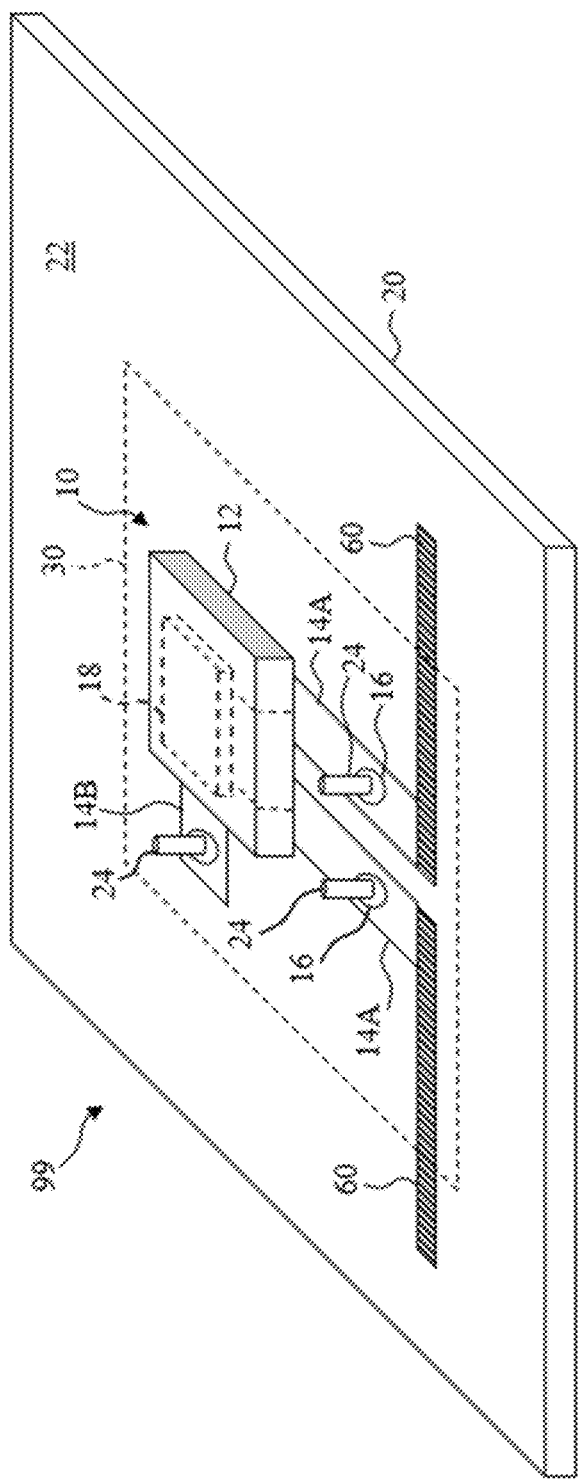

Referring to FIG. 4 and FIG. 5, a component assembly 99 of the present invention can comprise a support 20. The support 20 can have a surface 22 with a receiving zone 30 in which one or more components 10 can be disposed, for example by pick-and-place equipment. One or more positioning pins 24 are disposed on and protrude from the support 20 in the receiving zone 30. A component 10 is disposed on or over the surface 22 of the support 20 within the receiving zone 30.

A positioning pin 24 can be disposed within only one alignment hole 16 of the component, or a positioning pin 24 can be disposed within each of at least two alignment holes 16 of the component, or a positioning pin 24 can be disposed within each alignment hole 16 of the component.

As shown in FIG. 4, the component 10 may have both connected leads 14A that are electrically connected to the circuit 18, and disconnected leads 14B that are not electrically connected to the circuit 18. (Connected leads 14A and disconnected leads 14B are collectively referred to herein as leads 14.) Both connected leads 14A and disconnected leads 14B may have an alignment hole 16 with a positioning pin 24 disposed in the alignment holes 16. A positioning pin 24 can be, but is not necessarily, electrically conductive and may be electrically connected to a lead 14.

Referring to FIG. 5, the component 10 can have connected leads 14A electrically connected to the circuit 18, some of which have more than one alignment hole 16 and some of which do not have any alignment holes 16. It is an advantage of this embodiment that the component 10 can be accurately positioned by means of only one elongated lead.

A support 20 can be planar (as shown in FIG. 4 and FIG. 5) or non-planar (not shown). A support 20 can have wires 60 integrated into the support 20 to form, for example, a printed circuit board or other wiring board or wires 60 can be provided separately from the support 20. A wire 60 can be electrically connected to each connected lead 14A. Referring to FIG. 6A, wires 60 can be directly connected, mechanically or electrically, to the positioning pins 24 or leads 14, or both. Referring to FIG. 6B, wires 60 can be provided independently of the support 20, for example as cables that are electrically connected to leads 14 directly (as shown) or indirectly (not shown). In some embodiments, the cable wires 60 can be directly connected to the positioning pins 24.

In various embodiments, the support 20 can comprise a resin or epoxy substrate, a multi-layer structure, for example planar structures, a cast, molded, or machined part or structure, for example comprising a polymer, metal, metal alloy, or ceramic. Likewise, the positioning pins 24 can be cast, molded, or machined, or formed by etching a part or structure. The positioning pins 24 may be electrically conductive or electrically insulating, and may comprise a polymer, metal, metal alloy, or ceramic. The positioning pins 24 may be rigid, flexible, compliant, or ductile. A positioning pin 24 may be electrically connected to each of, any one of, or none of the leads 14 and the wires 60.

According to embodiments of the present invention, the positioning pins 24 disposed in the alignment holes 16, for example by locating components 10 on the receiving zone 30 on or over the surface 22 of the support 20 with the positioning pins 24 disposed in the alignment holes 16 by pick-and-place equipment, serve to precisely locate the component 10 with respect to the support 20 in a simple and inexpensive way that can be applied to a broad variety of component assembly structures. By requiring at least two positioning pins 24 in respective alignment holes 16, the component 10 is spatially fixed in position with respect to the support 20 so that component 10 cannot rotate or move with respect to the support 20. By providing alignment holes 16 in the leads 14, additional alignment or mounting structures are rendered unnecessary, for example special housing 18 and support 20 structures, so that the components 10 can be smaller and take up less area of the support 20. Or stated in other words, for the particular package shown in FIG. 1 and FIG. 3, by providing alignment holes 16 in the three elongated leads 14, other structures (e.g. located at the corners of the lead frame) can be avoided, thus layout structures and existing mounting equipment can still be used.

Referring to FIG. 7, in an embodiment the location of the component 10 is controlled in the height direction or the z-axis (controlled with respect to the distance between the surface 22 of the support 20 and the component 10). The height of the component 10 with respect to the support 20 can be controlled with a positioning pin 24, for example by providing a variable diameter positioning pin 28 with a variable diameter that can accept an alignment hole 16 at only certain predefined z-axis locations or predefined heights above the support 20. The variable diameter may be continuous, as shown, or discontinuous, for example with stepped structures (not shown). In the case where circuit 18 is a sensor, e.g. a magnetic position sensor, the precise location of the sensor and any discrete passive components 19 can be important to the proper or accurate functioning of the sensor.

In some embodiments of the present invention, after the component 10 is disposed with positioning pins 24 in alignment holes 16, the positioning pin 24 can be deformed so that a portion of the positioning pin 24 is disposed over a portion of the electrically conductive exterior portion 15 of the lead 14 that is not the alignment hole 16 in the lead 14, e.g. adjacent the alignment hole. For example, as shown in FIG. 8, the positioning pin 24 is deformed by bending the positioning pin 24 so that a portion of the bent deformed positioning pin 26 is located over a non-alignment-hole portion of the lead 14, that is over a conductive portion of the lead 14, such as a metallic portion, and is not only over the alignment hole 16.

In the example of FIG. 9, the positioning pin 24 is deformed by flattening the positioning pin 24 so that a portion of the flattened deformed positioning pin 26 is located over a metal portion of the lead 14, adjacent the alignment-hole 16.

Positioning pins 24 may be mechanically deformed, e.g. plastically or permanently deformed (in contrast to elastically deformed), for example by striking the positioning pin 24 with a hammer on the side of the positioning pin 24 to bend it or on the top of the positioning pin 24 to flatten it. By deforming a positioning pin 24 within an alignment hole 16 of a lead 14, a component 10 is held in place and is not readily removed from the positioning pin 24 and support 20.

In other or additional embodiments of the present invention, the wire 60, positioning pin 24 and lead 14 may be soldered together with solder 50 to form an electrical connection electrically connecting the circuit 18 to the wires 60 and the positioning pin 24 through the lead 14, if the lead 14 is a connected, electrically conductive lead 14A and the positioning pin 24 is electrically conductive, so that the positioning pin 24 is electrically connected to the lead 14 in whose alignment hole 16 the positioning pin 24 is disposed.

Figure 10:
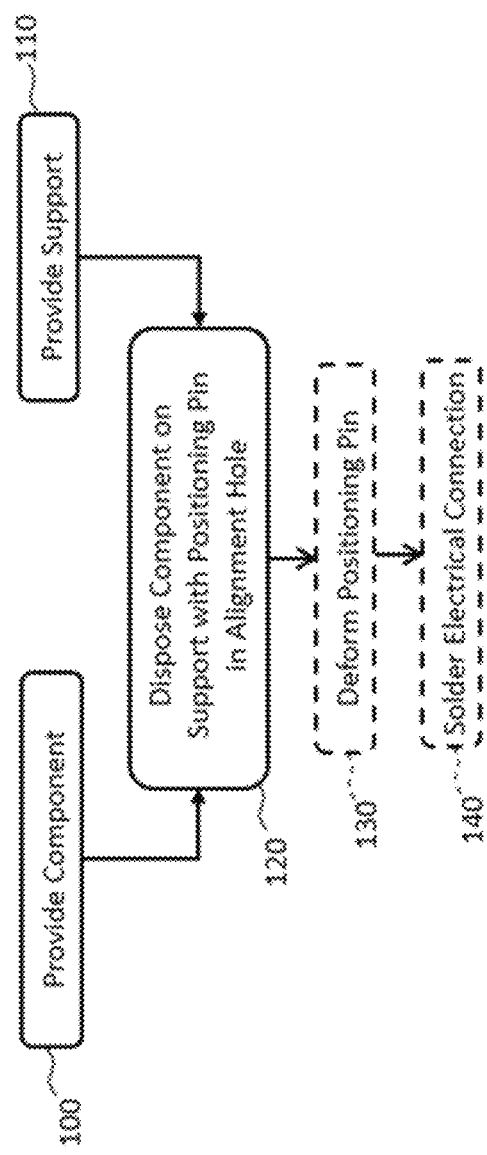

Referring to the flow-chart of FIG. 10, a component assembly 99 of the present invention can be constructed by providing a component 10 as described above in step 100, for example using photolithographic methods to form a circuit 18, for example comprising an integrated circuit (IC) and optionally one or more discrete passive or active circuit elements, assembling the IC and circuit elements onto a substrate, for example a semiconductor, glass, or ceramic substrate, and interconnecting them with any combination of wire bond or photolithographic methods and tools to form an assembled circuit 18. Leads 14 are constructed using metal forming methods and integrated into a housing 12 into which the assembled circuit 18 is disposed and electrically connected to the interior portion of the leads 14 inside the housing 12 using, for example, wire bonding methods. The housing 12 is then enclosed and encapsulated as desired.

A support 20 with one or more protruding positioning pins 24 is provided in step 110, for example by molding or laminating layers of resin or casting, molding, or machining materials such as ceramics, metals, or metal alloys into a desired shape, the shape providing a surface 22 with positioning pins 24 protruding from a surface 22 of the support 20 within a pre-determined receiving zone 30 for locating a component 10. In some embodiments, positioning pins 24 are partly inserted in through-holes of a PCB, and optionally soldered at the bottom side.

In step 120, a component 10 is disposed on a support 20 such that the alignment holes 16 of the component 10 are aligned with the positioning pins 24 of the support, and the positioning pins 24 are inserted into the alignment holes 16 (or vice versa), for example using pick-and-place equipment from a tape-and-reel package.

Once the component 10 is properly disposed in the receiving zone 30 of the support 20, in optional step 130 the positioning pins 24 can be optionally deformed to firmly, rigidly, permanently or irreversibly hold the component 10 in position with respect to the support 20. Multiple positioning pins 24 may be bent in different directions or deformed to widen the position pins 24, thus preventing each lead 14 from escaping the corresponding positioning pin 24. The deformation may locate at least a portion of the positioning pin 24 over a metal portion of the lead 14, adjacent the alignment hole 16. The deformation can provide mechanical robustness to the component assembly 99 and prevent the differential movement of the component 10 and the support 20, for example as a result of vibration.

In optional step 140, the positioning pins 24 may optionally be soldered to the leads 14, for example to provide electrical connections between the lead 14 and the wire 60, and optionally the positioning pin 24. The solder 50 can also provide additional mechanical strength to the physical connection between the component 10 and the support 20.

In operation, power may be provided to a wire 60 and hence to a lead 14 and circuit 18. Signals from the circuit 18 are sent through another lead 14 and wire 60 to a controller (not shown in the figures).

FIG. 11 to FIG. 14 show another exemplary component 10 according to an embodiment of the present invention. The component of FIG. 11 to FIG. 14 can be seen as a variant of FIG. 2. The main differences being that the component of FIG. 11 to FIG. 14 does not necessarily comprise alignment holes, and that the elongated leads 14A do not necessarily contain three segments having three different widths but may contain two segments having two different widths. Other features described above may also be applicable here. The main focus of the embodiments of FIG. 11 to FIG. 18 is related to the recesses 13, as will be discussed further.

Figure 11:
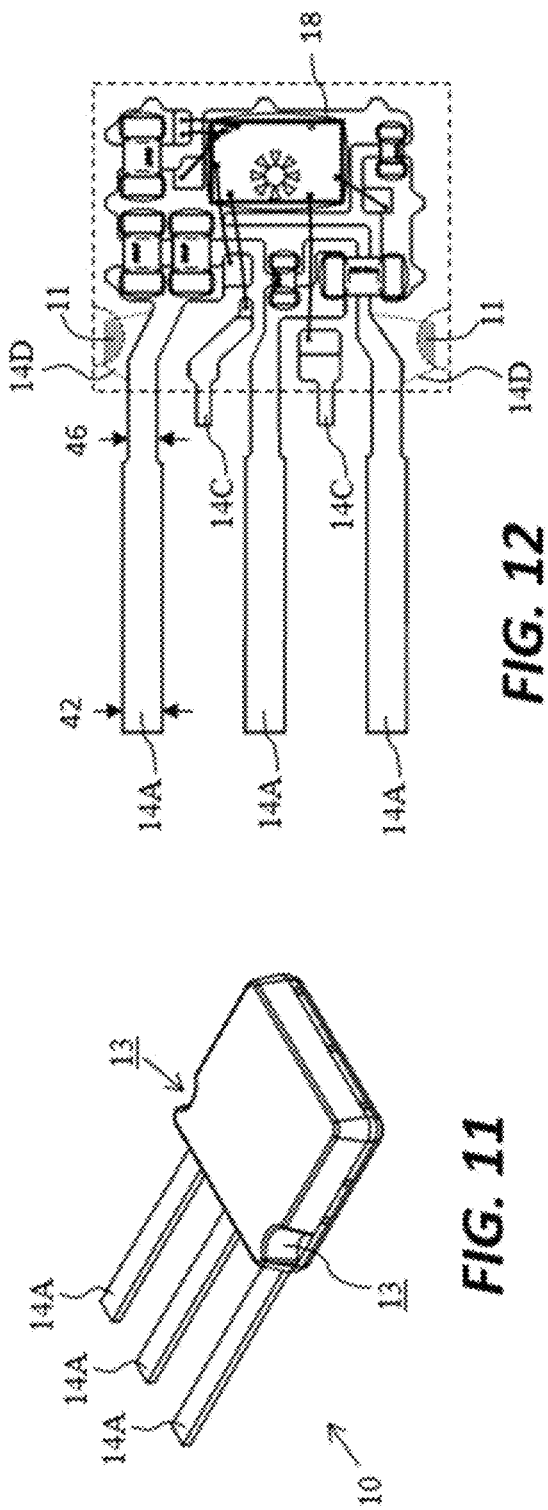

The component 10 shown in FIG. 11 comprises a housing 12, and a lead frame, and a magnetic sensor circuit 18. The housing may comprise a thermoset plastic material. The lead frame comprises at least three elongated leads 14A having an exterior portion 15 extending from the housing 12. The magnetic sensor circuit 18 may comprise at least one Hall element, or a plurality of Hall elements, and is disposed in the housing, and is connected to the lead frame. The housing 12 comprises two recesses 13 arranged on opposite sides of the housing. The recesses may have a shape comprising a bottom portion substantially parallel to the lead frame. The recesses may have a frusto-conical wall portion or a cylindrical wall portion. The component 10 of FIG. 11 has three elongated leads 14A, but the invention is not limited thereto, and in alternative embodiments, the component 10 has five elongated leads 14A.

Figure 12:
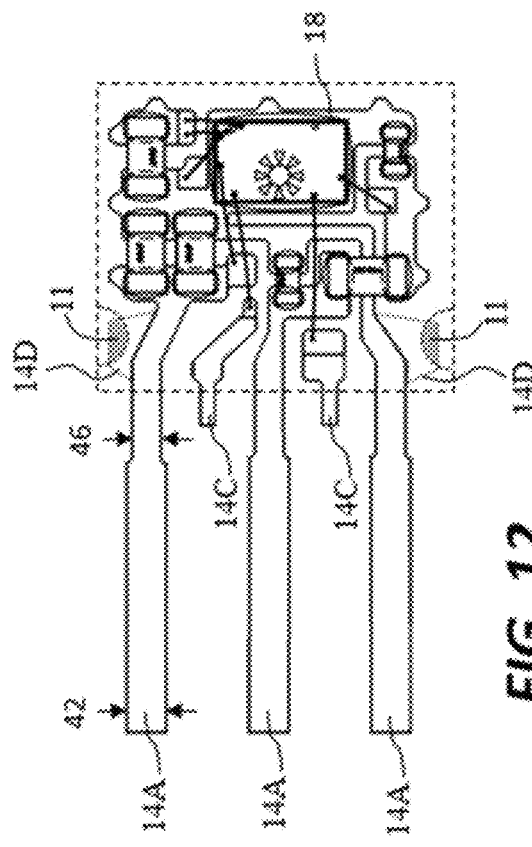

FIG. 12 shows a top view of the component of FIG. 11 without the housing, for illustrative purposes.

The component of FIG. 12 has three elongated leads 14A. The leads 14A of the component 10 shown in FIG. 12 do not have alignment holes 16, and therefore also do not require a central portion as described above.

The component 10 may comprise a plurality of tabs or test pins 14C located substantially halfway between proximal portions of the elongated leads 14A. These tabs or test pins 14C may have very small dimensions, for example have an external length of about 0.7 mm and an external width of about 0.3 mm, while allowing distal portions of the elongated leads to be spaced apart by about 2.5 mm from centerline to centerline. If the test pins are present (as shown in FIG. 12), the elongated leads 14A preferably have a proximal segment having a first width 46, and a distal segment having a second width 42 larger than the first width 46. If the test pins 14C are not present, the elongated leads 14A may have a constant width.

The recesses 13 of the housing 12 may overlap at least a portion 14D of the lead frame and/or of the elongated leads in an overlapping area 11. An inner portion of the elongated leads 14A may be broadened or widened to create such an overlap (see FIG. 12). Optionally, the lead frame portion containing the magnetic sensor circuit 18 contains the overlapping zones 11 (not shown).

Figure 13:
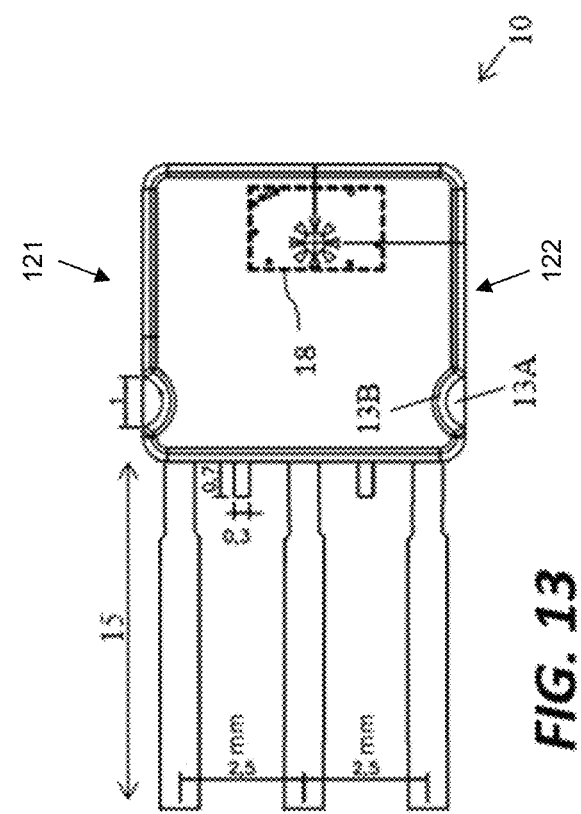

FIG. 13 shows the component of FIG. 11 in top view, including the housing. The component 10 of FIG. 13 has only two recesses 13, but the present invention is not limited thereto, and alternative embodiments may comprise more than two recesses, e.g. three recesses (see e.g. FIG. 20) or four recesses (not shown). In case of a component with comprising three recesses, one of the recesses is located at a first lateral side 121 of the housing, e.g. substantially in the middle of the first lateral side, and the other two recesses are located at a second lateral side 122 opposite the first lateral side 121, for example substantially near two of the corners of the housing. In case of a component comprising four recesses, two of these recesses are located at the first lateral side, two other of these recesses are located at the second lateral side opposite the first lateral side, e.g. near the four corners of the housing.

FIG. 14 shows the component of FIG. 13 in side view. A bottom of the recesses 13 of the housing 12 may be located at a predefined distance "d" (see FIG. 14) above the lead frame (e.g. at least 0.5 mm). Thus, the lead frame is not exposed at this location, but is covered for example by a plastic molding material, even at the location of the recesses 13.

In other embodiments, a portion of the lead frame is exposed near the recesses, and a bottom of the recesses may be formed by the exposed portion of the lead frame.

FIG. 15 shows the component of FIG. 11 and an exemplary support 20 comprising two protrusions 32 for holding said component 10. The support 20 may comprise or mainly comprise or consists of a plastic material. The protrusions 32 may have any suitable shape, e.g. substantially cylindrical. The support 20 has a receiving zone 30 between the two protrusions for accommodating the component 10. The distance between the protrusions 32 is preferably only marginally larger than an outer dimension of the housing 12. The protrusions 32 may be formed integrally with the rest of the support 20. The protrusions are made of a deformable material, e.g. thermoplastic or metal or a metal alloy.

FIG. 16 shows a component assembly 99 comprising the support 20 and the component 10 of FIG. 15. The protrusions 32 are deformed so as to align the component 10 and so as to clamp the component 10 on the support 20.

Figure 17:
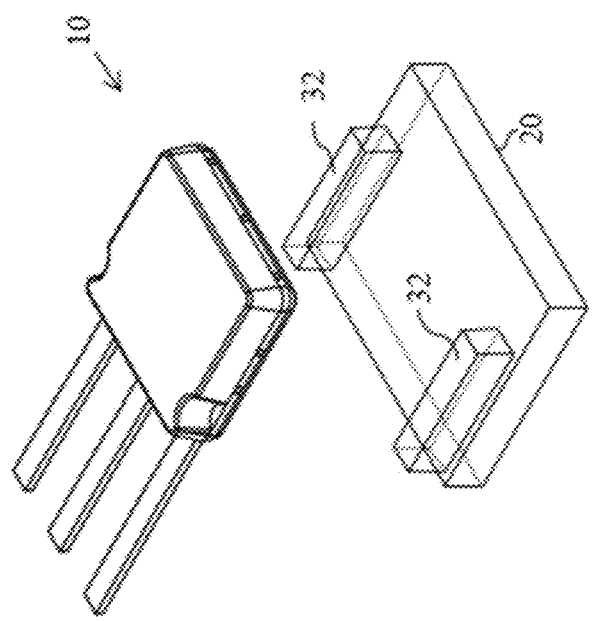

FIG. 17 shows the component of FIG. 11 and another exemplary support comprising two beam shaped protrusions 32 for holding said component 10.

The protrusions 32 are preferably deformed against an inclined wall of the component 10, and in such a manner that at least a portion of the protrusions enters the space defined by the recesses 13, for clamping the component 10. A component assembly (not shown) where the component is clamped in this manner, is also envisioned.

FIG. 18 illustrates a method 1800 of producing a component assembly 99, such as the one shown in FIG. 16. The method 1800 comprises the following steps:
  a) providing 1801 a component 10 with recesses 13, for example as shown in FIG. 11 to FIG. 17;
  b) providing a support 20 having a receiving zone 30 and at least two deformable protrusions 32, for example as shown in FIG. 15 and FIG. 17;
  c) disposing 1803 the component 10 on or over the support 20 within the receiving zone 30 between said protrusions 32 such that the recesses 13 of the component are located adjacent said protrusions 32 of the support 20; and
  d) deforming the protrusions 32 such that the protrusions are at least partially disposed within the recesses 13 (or stated in other words: such that at least a portion of the material of the protrusions has entered the recesses), thereby aligning and clamping the component 10 on the support 20.

FIG. 19 to FIG. 45 are mainly related to sensor components and assemblies where the component has a housing with at least two (e.g. two or three or four) recesses and/or at least two (e.g. two or three or four) protrusions (also referred to herein as "ears" or "lateral ears"). Some embodiments may have "lateral recesses" but no "lateral ears", other embodiments may have "lateral ears" but no "lateral recesses", preferred embodiments have both "lateral recesses" and "lateral ears". The recesses, if present, may take the form as described above (in FIG. 1 to FIG. 18), e.g. having a frusto-conical shape or a cylindrical shape, or a pyramid-shape, or a truncated pyramid shape, but other shapes are also envisioned, e.g. slanted side wall portions, e.g. forming an angle from 18° to 22° with the lead frame, etc. The lateral protrusions (or ears), if present, may comprise a hole, but that is not absolutely required. The component may comprise a single magnetic sensor chip or may comprise two magnetic sensor chips. The two components may share supply pins (typically referred to as GND and VDD) or may have separate supply pins. The component may comprise three or four or five or six elongated leads. The components shown or used in FIG. 19 to FIG. 31 do not necessarily comprise alignment holes, do not necessarily comprise tabs or test-pins located between the elongated leads, not necessarily comprise elongated leads having an exterior portion with three different widths. Various embodiments will now be described in more detail.

Figure 19D:
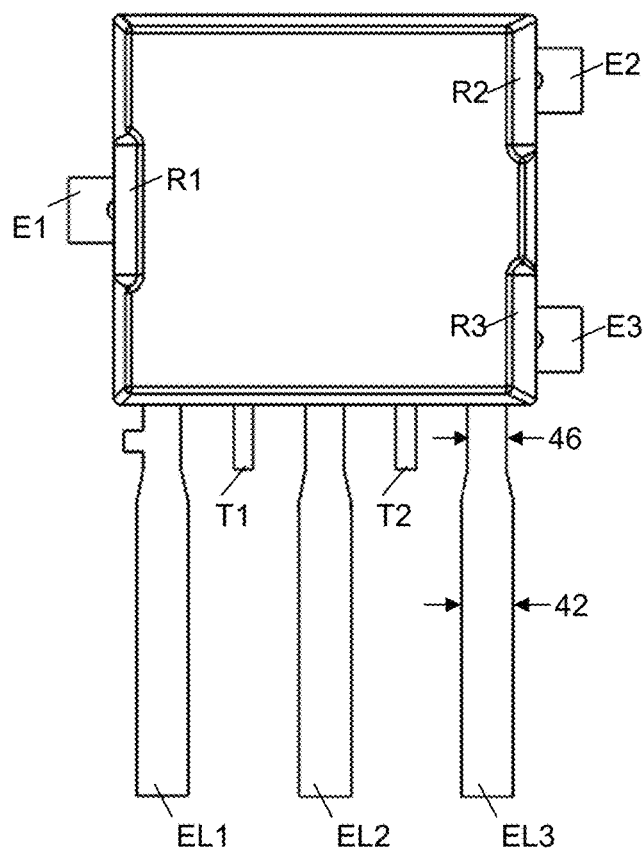
FIG. 19(d) shows a top view (from viewing position C).

FIG. 19(a) shows a perspective view, FIG. 19(b) shows a side view (from viewing position A), FIG. 19(c) shows a front view (from viewing position B), and FIG. 19(d) shows a top view (from viewing position C) of an exemplary sensor component 1910 according to the present invention. This sensor component has three elongated leads EL1, EL2, EL3 and two tabs T1, T2 situated between the elongated leads. The sensor component further comprises three recesses R1, R2, R3, in the form of slanted wall portions forming an angle of about 18° to about 22° with the lead frame. The upright wall portions without recesses may form an angle of about 8° to about 12° with the lead frame. The lead frame of the component has one protruding portion or ear E1 extending from a first lateral side, and has two protruding portions or ears E2, E3 extending from a second lateral side, opposite the first lateral side. The first recess R1 is located substantially in the middle of the first lateral side. The recesses R2, R3 are located at outer ends of the second lateral side, near the corners of the housing. The ears E1, E2, E3 are substantially centered with respect to the corresponding recesses R1, R2, R3.

The ears E1, E2, E3 and/or the elongated leads EL1, EL2, EL3 can be used to accurately position the sensor component on a support (as will be described further, see e.g. FIG. 32 to FIG. 43), and the ears E1, E2, E3 and/or the recesses R1, R2, R3 and/or the elongated leads EL1, EL2, EL3 can be used to fixedly mount the sensor component on the support.

As shown in FIG. 19(d), the elongated leads EL1, EL2, EL3 may have a proximal portion with a first width 46, and a distal portion with a second width 42 larger than the first width, and an intermediate portion having a width that gradually increases from the first width 46 to the second width 42, but that is not absolutely required for the invention to work, and a stepwise increase, or an abrupt increase, or even a non-monotonically increase can also be used. As mentioned above, if the test pins are omitted, the elongated leads EL1, EL2, EL3 may have an exterior portion with a constant width 42.

The first elongated lead EL1 may be used as a supply voltage line VDD, the second lead EL2 may be used for outputting a signal, e.g. an angular value based on one or more measurements of a magnetic field, and the third lead EL3 may be used as a reference voltage or ground line GND.

It is an advantage of using a package with three lateral protrusions instead of only two, because it allows a stable positioning on a support, with a reduced tilt error.

Figure 20:
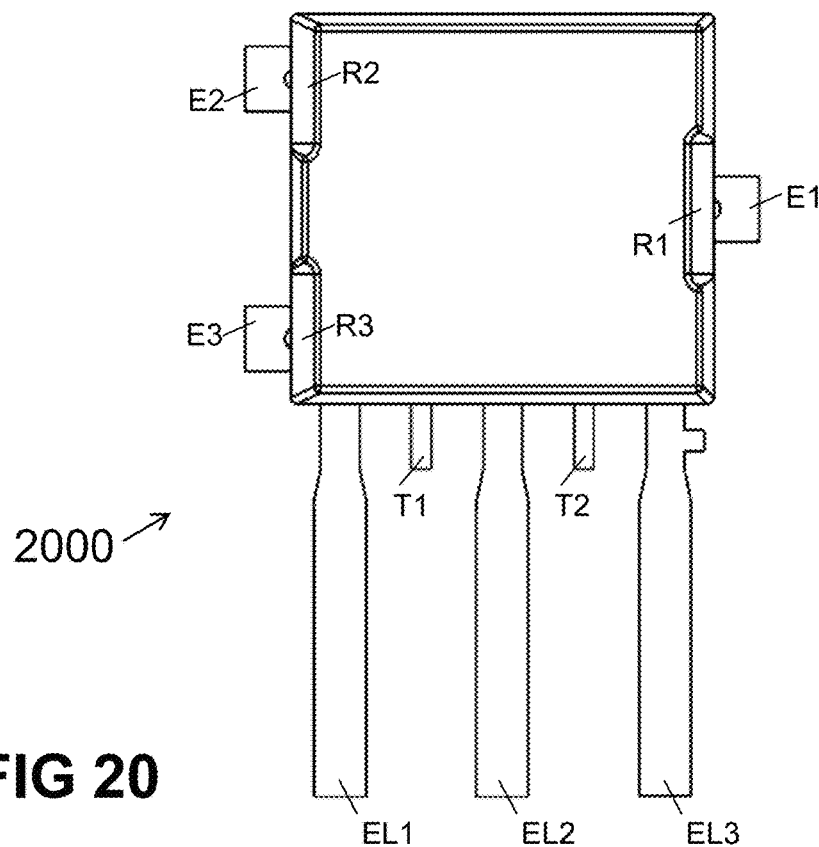

FIG. 20 shows a variant of the component of FIG. 19 in top view. This package outline is a mirrored version of the package outline of FIG. 19(a) to FIG. 19(d). In this embodiment, EL1 may be used as the ground pin GND, EL2 may be used for providing the output signal, and EL3 may be used as the supply voltage VDD pin.

Figure 21A:
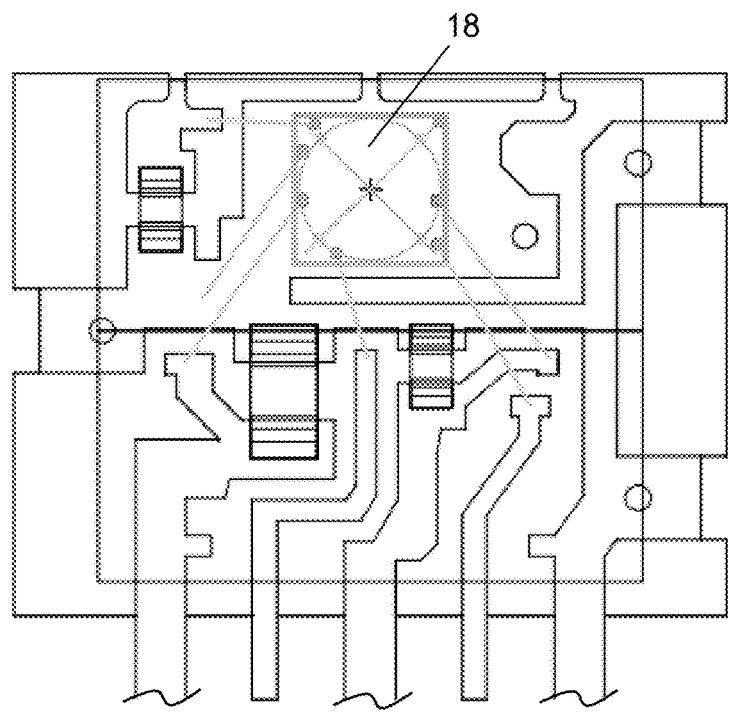
FIG. 21(a) shows an example of a component having a package as illustrated in FIG. 19, showing inter alia the shape and relative position of the lead frame, portions of the elongated leads, optional test pins, bond wires, a magnetic sensor device in the form of a semiconductor device, and three integrated SMD components.

FIG. 21(a) shows a possible layout of a lead frame as can be used in the sensor component of FIG. 19, showing various portions of the lead frame, portions of the elongated leads, optional test pins, bond wires, a magnetic sensor circuit 18 in the form of an integrated semiconductor die, and three integrated SMD components, e.g. capacitors or resistors. The magnetic sensor circuit 18 has a substantially square shape, but of course the present invention is not limited hereto, and other magnetic sensor circuits, for example having a rectangular shape, can also be used, even with this exact same lead frame.

Figure 21B:
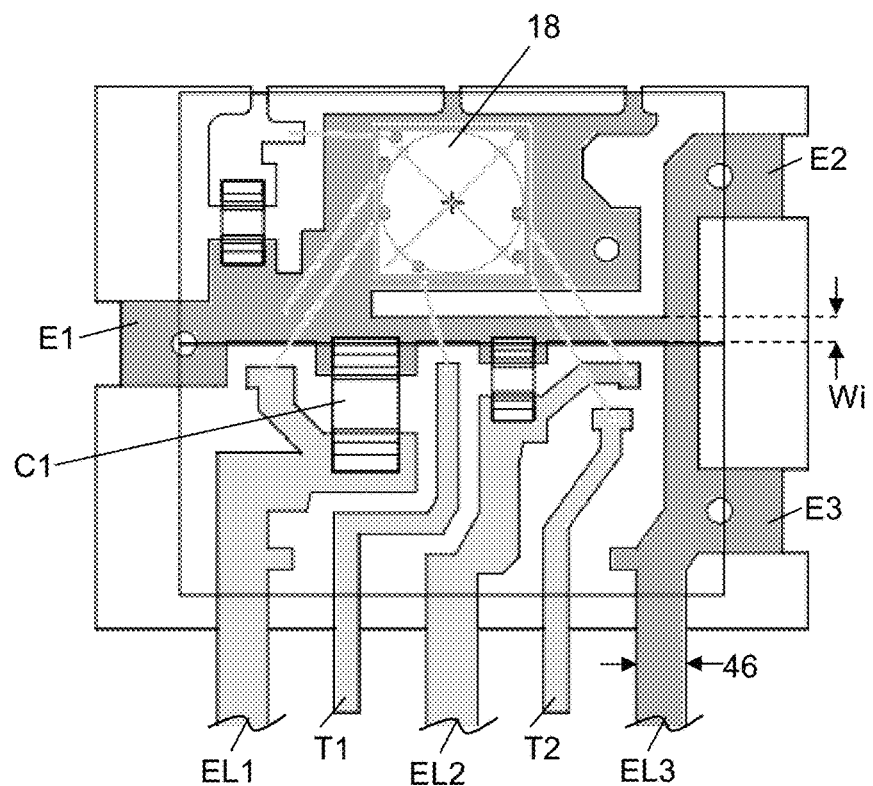
FIG. 21(b) is a shaded version of FIG. 21(a) showing (inter alia) that one of the elongated leads is integrally formed with a first (main) portion of the lead frame that supports the magnetic sensor, and showing that the other two elongated leads are not integrally formed with said first portion of the lead frame, but are connected thereto by means of SMD components.

FIG. 21(b) shows a shaded version of FIG. 21(a) showing (inter alia) that one of the elongated leads EL3 (preferably used as GND) is integrally formed with a first (or main) portion of the lead frame that supports the magnetic sensor circuit 18. As can be seen, the other two elongated leads EL1, EL2 are not integrally formed with said first (or main) portion of the lead frame but are electrically and mechanically connected thereto by means of at least one SMD component, e.g. a capacitor. Bond wires are used to interconnect the elongated leads EL1, EL2, EL3 and if present, the test pins T1, T2 with bond pads of the magnetic sensor circuit 18. As can also be seen, in this example, the three lateral extensions or ears E1, E2, E3 are integrally formed with the third lead EL3 and with the first (main) portion of the lead frame, although that is not absolutely required for the invention to work. With "main portion" of the lead frame is meant the portion where a largest possible rectangle can be located.

In the example shown in FIG. 21(b), the main portion of the lead frame that supports the magnetic sensor circuit 18 has a substantially rectangular shape (see also FIG. 22), and the exterior portion (i.e. the portion that will be located outside of the housing) of the elongated lead EL3 is integrally connected to said main (rectangular) portion of the lead frame via a relatively narrow and relatively long "interconnection portion" having a width "Wi" (oriented horizontally in FIG. 21). The width Wi of this interconnection portion is smaller than the width 46 of the "proximal portion" of the lead EL3 (that will be located outside the housing), and a ratio (L/W) of the length and the width of this "intermediate interconnection portion" is more than 5, or more than 6, or more than 7, or more than 8.

Figure 22:
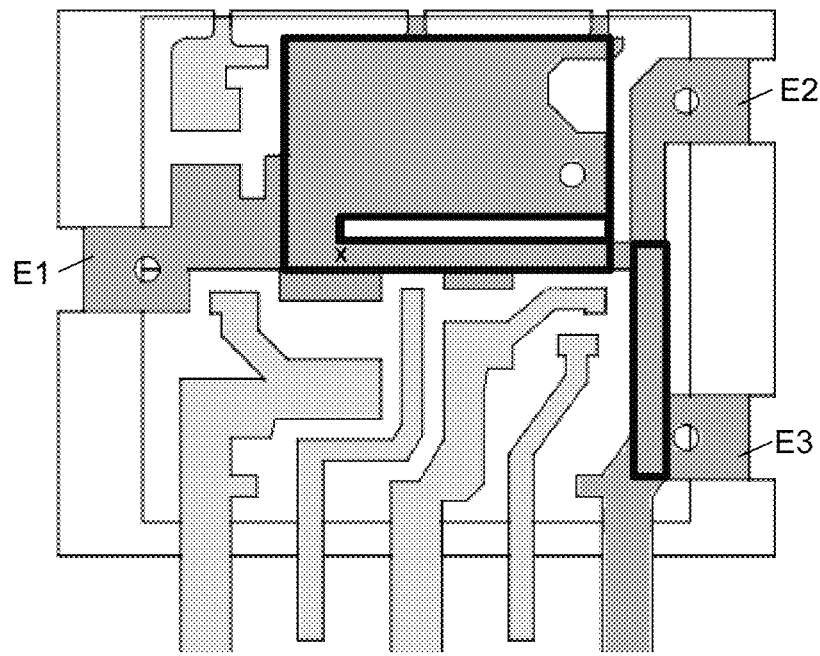

FIG. 22 shows the lead frame of FIG. 21(b), and highlights four rectangular regions thereof:
  a first rectangle indicating the first (main) substantially rectangular portion of the lead frame that supports the magnetic sensor circuit 18 (not shown in FIG. 22, but see FIG. 21(b)),
  a second rectangle showing an elongated cut-out (indicated in white color),
  a third rectangular portion corresponding to the "relatively narrow a relatively long interconnection portion" described above (oriented horizontally in FIG. 21), and
  a fourth rectangular portion (oriented vertically in FIG. 22), situated between an interior portion of the lead EL3 and the "interconnection portion".

It can also be appreciated that mechanical forces exerted upon the ears E2, E3, especially mechanical pressure forces exerted in a direction perpendicular to the lead frame, will only induce a negligible mechanical stress on the first (main) lead frame portion, thanks to relatively long and relatively narrow legs of the T-shaped interconnection between the point indicated by "x" and the ears E2, E3. The same is true for mechanical pressure forces exerted upon the elongated leads, in a direction perpendicular to the lead frame, not only because of the relatively long and relatively narrow external portions of the elongated portions, but also due to their interconnection to the first (main) lead frame portion: e.g. via one or more passive SMD components, or via one or more relatively narrow and relatively long (e.g. L/W≥4) interconnection portion(s).

Figure 23:
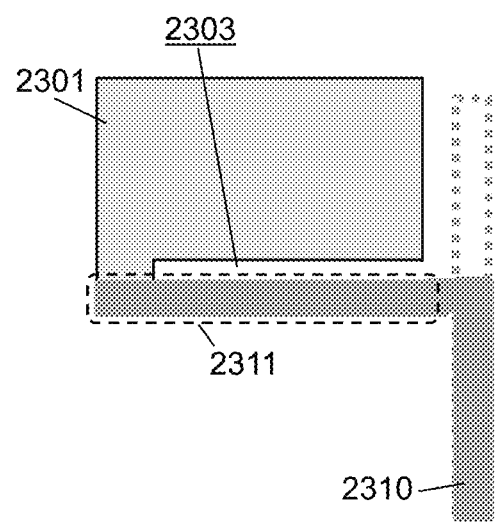

FIG. 23 is an abstract representation of the rectangles discussed in FIG. 22, further illustrating that the (third) rectangular interconnection portion 2311 and the fourth rectangular portion 2310 connected thereto, form an L shape and/or T-shape with said elongated lead.

During development and testing it was found that a prototype of the component having the same lead frame layout as shown in FIG. 22, except for the cut-out, did not satisfy the "bulk current injection" test, for example the BCI-test, as part of the Closed Loop Method according to norm or standard ISO 11452-4, and it was surprisingly found that the component of FIG. 22 with the cut-out did satisfy the "bulk current injection" test. Since the layout without the cut-out does not, and the layout with the cut-out does pass the test, it can be concluded that the lead frame design shown in FIG. 22 where the first (main) portion of the lead frame has an elongated cut-out, yields an improved EMI/EMC behaviour.

FIG. 24(a) shows another example of a component having a package as illustrated in FIG. 19 but having another lead frame. Most of what was described for the embodiment of FIG. 19 is also applicable here, mutatis mutandis. The main differences being: (i) the lead frame has a different shape, (ii) the magnetic sensor circuit 18 of FIG. 24(a) has a rectangular shape, (iii) the number and position of passive SMD components 2401 to 2404.

FIG. 24(b) shows the same picture as FIG. 25(a), but without the bond wires and without the magnetic sensor device.

FIG. 24(c) is a shaded version of FIG. 24(b) and shows how the first (main) portion of the lead frame is integrally formed with one of the elongated leads EL3 (used as the GND pin).

FIG. 25 is an abstract representation of the first (main) lead frame portion 2501 of FIG. 24(c), and the relatively long and relatively narrow "interconnection portion" 2511 situated between the proximal portion of the elongated lead EL3, and the first(main) lead frame portion 2501. During development and testing it was found that no cutout in the first lead frame portion was required in this case in order to pass the "bulk current injection test", but that it was sufficient to interconnect the first (main) lead frame portion and the elongated lead EL3 via an elongated interconnection portion 2511 having a width Wi smaller than the width 46 of the elongated lead EL3 over a length of at least 4 times said width, preferably at least 5 times.

Similar remarks regarding mechanical stress exerted upon the elongated leads and/or on the lateral protrusion E3 as mentioned above (see FIG. 22), can be made for the lead frame of FIG. 24(a) to FIG. 25. It is noted in this respect that the lateral protrusion E2 is not integrally connected with the lead frame.

FIG. 26 shows a variant of FIG. 25(b) having six integrated SMD components, as can be used in embodiments of the present invention, namely the four SMD components shown in FIG. 24(a) plus two additional components 2601, 2602. Of course, it is also possible to mount only five SMD components in this package.

FIG. 27 shows another component 2700 according to an embodiment of the present invention, having four elongated leads, having three (optional) tabs or test pins located between said elongated leads, having three recesses R1, R2, R3 (see FIG. 29 and FIG. 30), and having three protrusions E1, E2, E3 on the two lateral sides of the housing, and comprising two magnetic sensor devices 18a, 18b, stacked on top of each other.

Preferably the semiconductor dies 18a, 18b are designed such that the magnetic sensor location is offset from the geometric center of the die, and the semiconductor dies are stacked such that the sensor position of the first die 18a and the sensor position of the second die 18b substantially coincide, as described in more detail in European patent application number EP20197607.3, filed by the same applicant on 22 sept 2020, incorporated herein by reference in its entirety, see e.g. FIG. 7 to FIG. 9. The shift of the semiconductor dies allows easy wire bonding on the top side, while at the same time improving the similarity of the measurements, which makes the component of FIG. 27 ideally suited for use in industrial or automotive applications where functional safety and high accuracy are important. It is pointed out that FIG. 27 shows an embodiment wherein the two semiconductor dies are shifted and 180° rotated, but the present invention is not limited thereto, and other stacked die arrangements are also envisioned, for example as illustrated in any of the Figures of EP patent application number EP20197607.3.

It is noted that the presence of three lateral protrusions (instead of only two) can help to reduce tilt of the sensor component with respect to an axis perpendicular to the elongated leads. This is particular advantageous for a package with two stacked dies, because a tilt error will result in a position error. Thus, by providing three lateral protrusions, the accuracy of the sensor device mounted on a support, can be improved.

Figure 28:
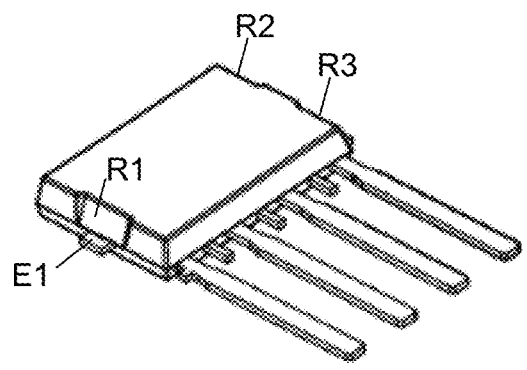
Figure 29:
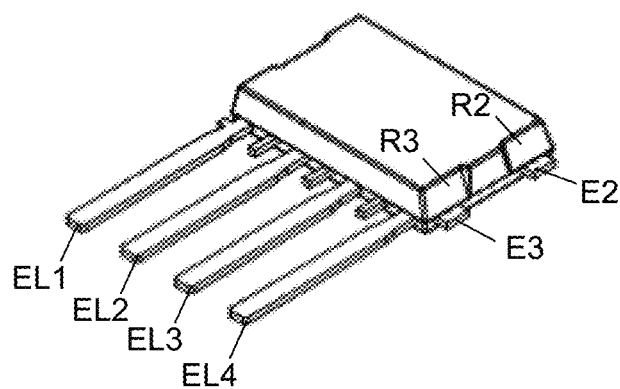

FIG. 28 and FIG. 29 show two perspective views of the component of FIG. 27, seen from two different viewing angles.

Figure 30:
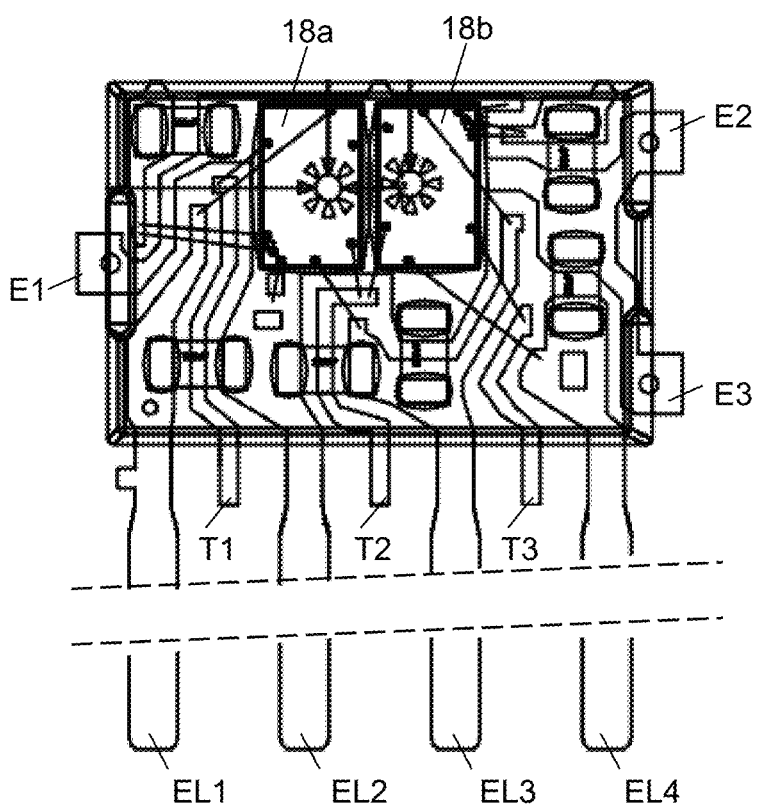

FIG. 30 shows a variant of FIG. 27, also comprising two magnetic sensor devices 18a, 18b, but mounted side by side on the lead frame. In this case, the two sensor devices will typically measure slightly different values. Preferably the sensor locations are located as close a possible to each other, in order to minimize the differences.

Figure 31:
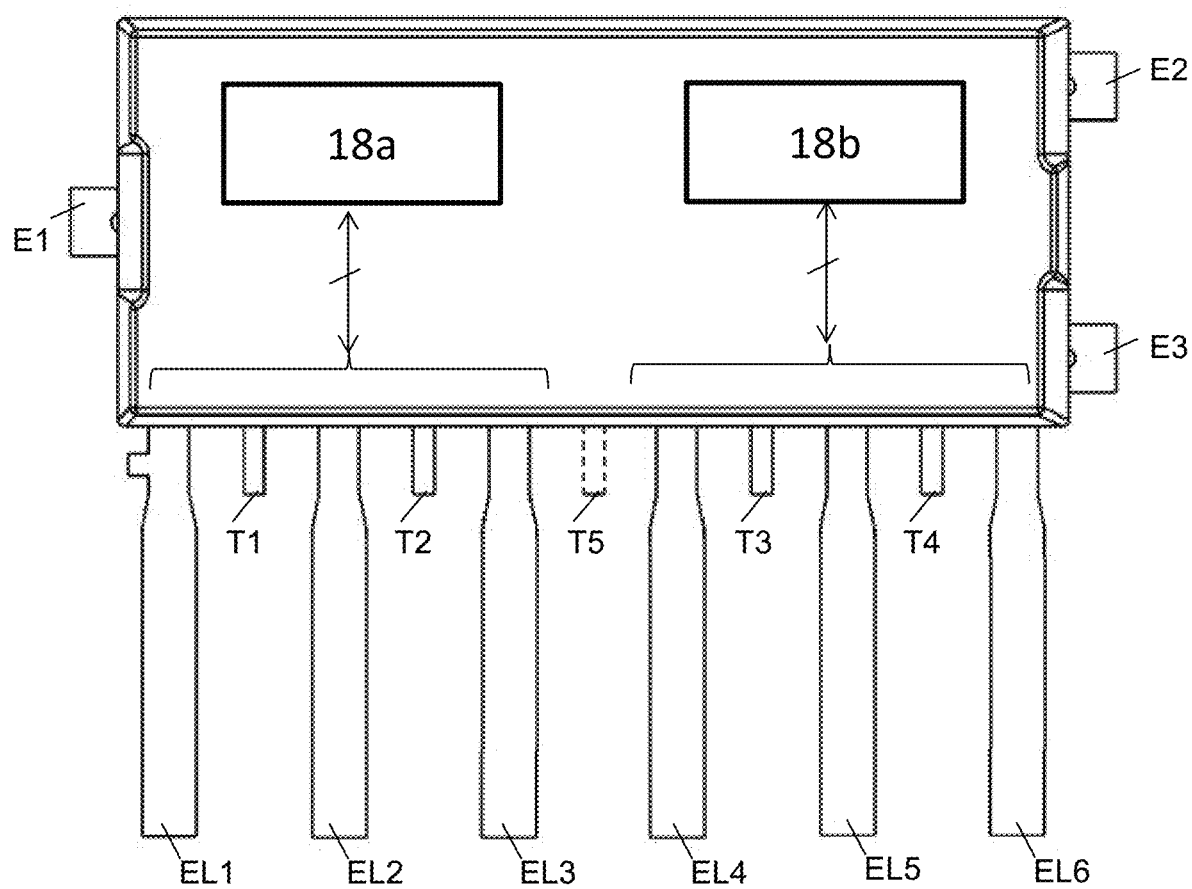

FIG. 31 shows another component according to an embodiment of the present invention, comprising two magnetic sensor devices 18a, 18b, six elongated leads EL1 to EL6, four or five test pins T1 to T5, three lateral recesses R1 to R3 and/or three lateral protrusions or ears E1 to E3.

In contrast to the embodiments of FIG. 27 and FIG. 30 where the two semiconductor dies 18a, 18b share one lead for the reference voltage (GND), and share one lead for the supply voltage (VDD), and each have their respective output lead, the package of FIG. 31 allows to galvanically separate the circuitry of the first magnetic sensor 18a and that of the second magnetic sensor 18b, and to provide each magnetic sensor their own associated leads (e.g. GND, VDD, OUT).

FIG. 32 to FIG. 44 are mainly related to component assemblies comprising a sensor component as described above and illustrated in FIG. 19 to FIG. 31, and a support, and to methods of making such component assemblies.

More specifically, the sensor components used in the assemblies of FIG. 32 to FIG. 41 have a housing with a plurality of at least two (e.g. two or three or four) recesses R1, R2, R3 and/or a plurality of at least two (e.g. two or three or four) protrusions or ears E1, E2, E3, and further comprise a plurality of at least three (e.g. three or four or five or six) elongated leads EL1, EL2, EL3, and further comprises at least one (e.g. one or two) magnetic sensor devices. Some or all of the elongated leads may be bent over an angle in the range from 30° to 150°, preferably in the range from 60° to 120°, or from 80° to 100°, for example over an angle equal to about 90°;

and the supports 20 used in the assemblies of FIG. 32 to FIG. 43 comprise a plurality of at least two first posts P1a, P1b, P1c, P1d (e.g. guiding posts, or alignment posts, or riveting posts) spaced apart from each other, and a plurality of at least two second posts P2a, P2b, P2c (e.g. guiding posts, or alignment posts, or riveting posts), and a plurality of at least three (e.g. three or four or five or six) electrical contacts or pens F1, F2, F3 for being electrically connected to the elongated leads EL1, EL2, EL3 of the sensor component.

Some or all of the plurality of first posts may be configured for receiving at least one of the elongated leads EL1, EL2, EL3 between them. The first posts may be configured for preventing movement of the sensor module in at least one direction (e.g. in the X-direction of FIG. 34) even if none of them is deformed.

Some or all of the plurality of second posts may have a cavity or cut-out or a groove configured for receiving or accommodating at least one of said lateral protrusions (or ears). In particular embodiments, the second posts have a U-shaped cross section (see e.g. FIG. 32 to FIG. 35). Some or all of the plurality of second posts may be spaced apart for receiving at least one of said lateral protrusions between them. The second posts may be configured for preventing movement of the sensor module in at least one, or in at least two directions (e.g. in the X and Y direction of FIG. 34), even if none of them is deformed.

Figure 34:
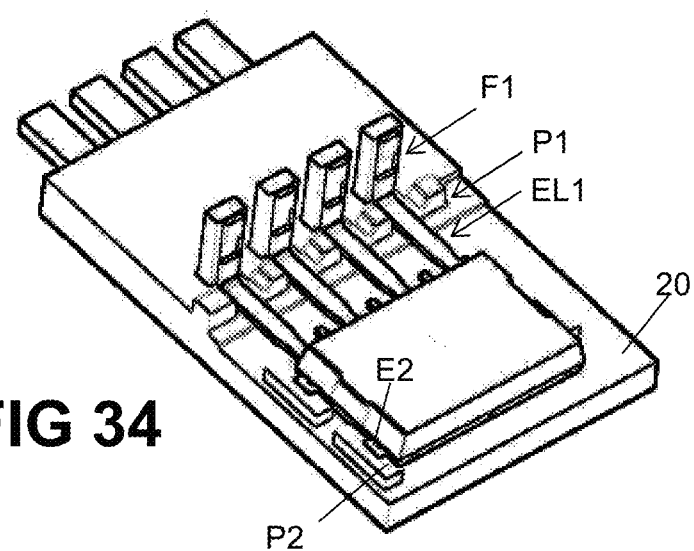

By mechanically and electrically connecting the elongated leads and the electrical contacts or pens of the support (e.g. by welding or soldering) movement of the elongated leads is restricted in three directions (e.g. X, Y, Z in FIG. 34). While the position of the sensor module is fixed by the electrical connections alone, such fixation may not be adequate when the sensor assembly is used in an industrial or automotive environment, especially when exposed to vibrations. The fixation can be improved by deforming some or all of the first posts and/or some or all of the second posts.

The second posts mays have a relatively small height (e.g. from 30% to 60% of the height of the housing of the sensor module), sufficient to at least partially cover and thus secure the position of the lateral protrusions E1-E3 after deformation of the second posts (e.g. by heat staking), or may have a relatively long height (e.g. from 70% to 150% of the height of the housing of the sensor module), sufficient to at least partially cover the surface of the recesses R1-R3 after deformation of the second posts (e.g. by heat staking).

Various embodiments will now be described in more detail.

FIG. 32(a) to (c) shows a component assembly 3200 comprising a support 20, and a sensor component having a housing 12 as illustrated in FIG. 19. The sensor component has three elongated leads ELL EL2, EL3 which are bent upwards over 90°, and are mechanically and electrically connected to three corresponding electrical (e.g. copper or aluminum) contacts F1, F2, F3 of the support. The elongated leads EL1-EL3 are located between a plurality of first posts P1a, P1b, P1c, P1d.

The sensor component has three lateral protrusions or ears E1, E2, E3 on opposite sides of the housing, and the support 20 has three second posts P2a, P2b, P2c, having a U-shaped cross-section surrounding said ears.

FIG. 32(a) shows the component assembly in perspective view.

FIG. 32(b) shows a cross section of the assembly according to the broken line A-A of FIG. 32(a). The second posts P2a, P2b of this example are relatively low (in this example extending to about 50% of the height of the housing) and are configured to at least partially cover the lateral protrusions E1, E2 when being deformed.

FIG. 32(c) shows a variant of FIG. 32(b), wherein the second posts are relatively high (in this example extending to about 120% of the height of the housing), and are configured to at least partially cover the recesses R1-R3, and preferably also the lateral protrusions.

FIG. 33 shows a variant of the assembly of FIG. 32, wherein the elongated leads are straight (i.e. not bent). As can be appreciated, the first posts restrict movement in the Y-direction, and the second posts restrict movement in the X and Y-direction. In this way the sensor module can be accurately positioned on the support. After electrically connecting the elongated leads to the electrical contacts, and/or deforming some or all of the first posts and/or deforming some or all of the second posts, the sensor module is secured to the support.

FIG. 34 shows a variant of the assembly of FIG. 32, wherein the sensor module has four elongated leads, and the support has five first posts P1 located adjacent these elongated leads and has three U-shaped second posts located adjacent the lateral protrusions. The elongated leads are bent substantially over 90°.

In a variant of this embodiment (not shown), the support has only four or only three first posts P1. Indeed, as mentioned above, it is not absolutely required that all the elongated leads are clamped on both sides, although they may.

Figure 35:
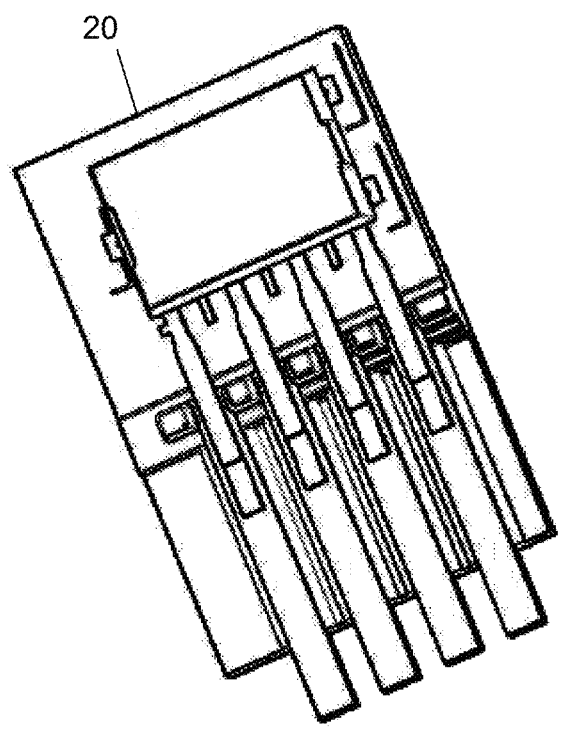

FIG. 35 shows a variant of FIG. 34, where the elongated leads are straight (not bent).

Figure 36:
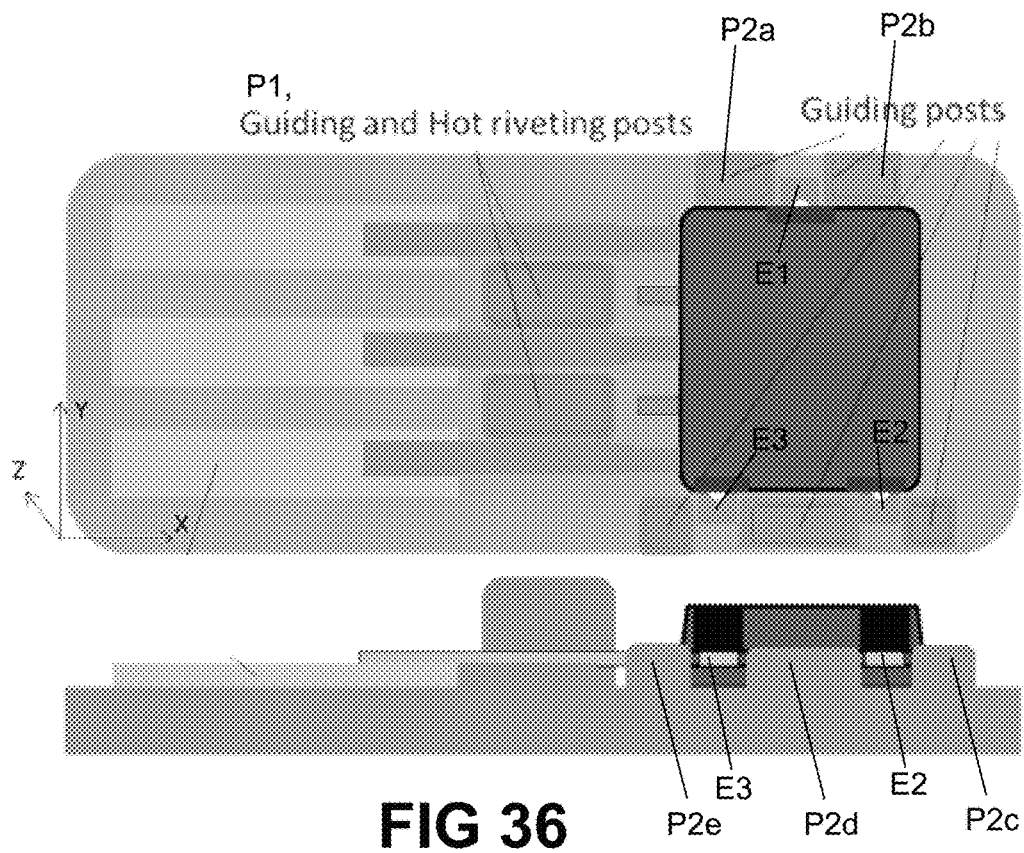

FIG. 36 illustrates another component assembly, in top view (upper part) and in side view (lower part), before heat staking. As can be seen, in this embodiment, the support contains only two first posts P1, having an elongated shape extending in the X-direction, configured for aligning the sensor module in the Y-direction and for prohibiting movement in the Y-direction. These posts are made of a material that can be heat staked. Hence these first posts may also be referred to as "Y guiding and hot riveting posts". The support further comprises five second posts, located adjacent and on opposite sides of the lateral protrusions E1, E2, E3, configured for aligning the sensor module in the X-direction, and for prohibiting movement of the sensor module in the X-direction. As can be seen, the first posts are relatively high (higher than the height of the housing), thus providing a relatively large amount of material to be heat steaked. As can be seen, the height of the second posts is relatively small, extending to a position only slightly higher than the position of the lateral protrusions.

Figure 37:
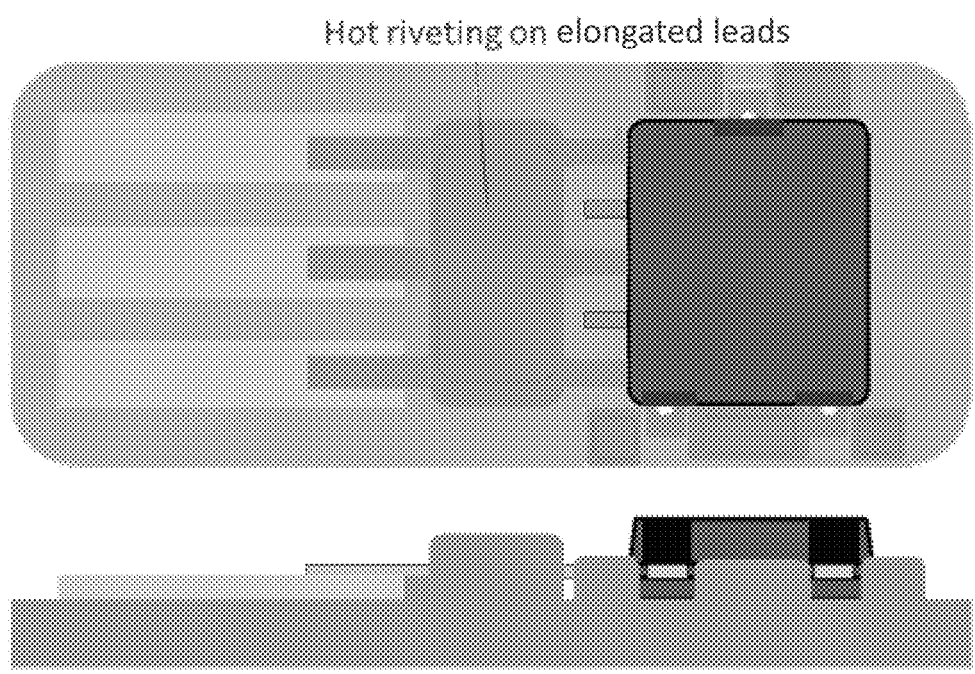

FIG. 37 shows the component assembly of FIG. 36 after heat staking. In this example, the material of the first posts is used to form a bridge over all the elongated leads, thereby preventing movement of the sensor component in the height direction Z (perpendicular to the plane of the drawing). As can be seen, only the first posts P1 are heat staked in this example, the second posts P2 are not deformed.

Figure 38:
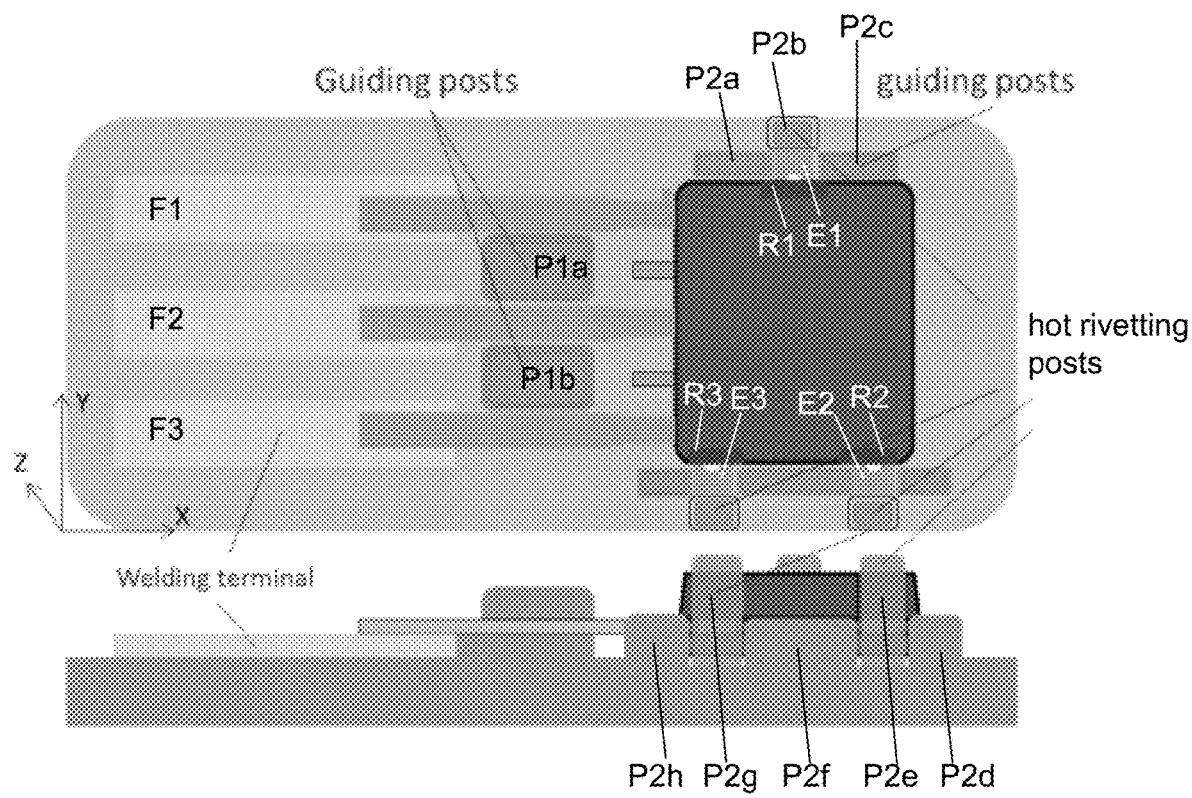

FIG. 38 illustrates another component assembly in top view (upper part) and in side view (lower part), before heat staking. This assembly can be seen as a variant of the component assembly of FIG. 36. The support of this example has also only two first posts, and their height is relatively low, because they are only intended for guiding, for positioning purposes, not for securing purposes. The support has eight second posts P2a-P2h, arranged in the vicinity of the lateral protrusions E1-E3 and in the vicinity of the lateral recesses R1-R3. Three of these second posts P2b, P2e, P2g are relatively high (higher than the height of the package), because they are intended to be heat staked over the respective recesses R1, R2, R3. The other second posts P2a, P2c, P2d, P2f, P2h are relatively low (extending to approximately 50% of the height of the package), because they are intended for guiding purposes only, and are not intended to be deformed.

Figure 39:
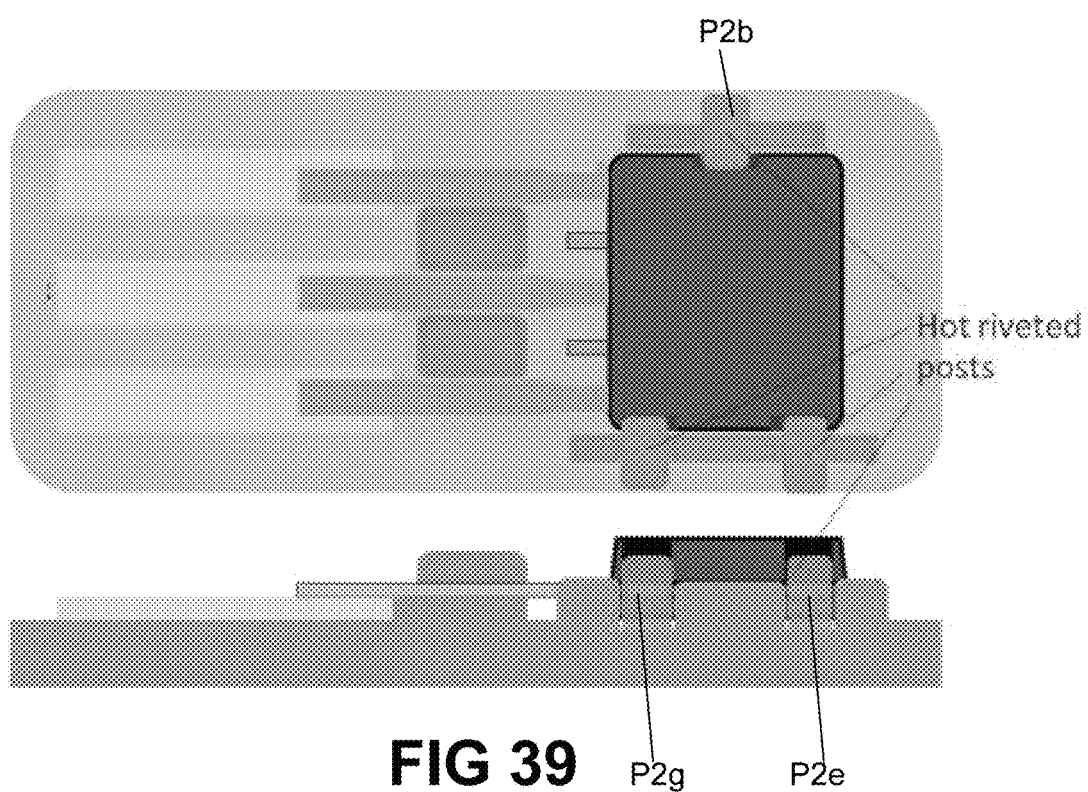

FIG. 39 shows the component assembly of FIG. 38 after heat staking some of the second posts, in the example: P2b, P2e and P2g. In addition to the heat staking, the elongated leads are electrically connected to respective electrical contacts, e.g. by welding or soldering. The electrical contacts may comprise a welding material, e.g. copper or aluminum, or a copper or aluminum alloy, optionally with a suitable coating for facilitating welding.

Figure 40:
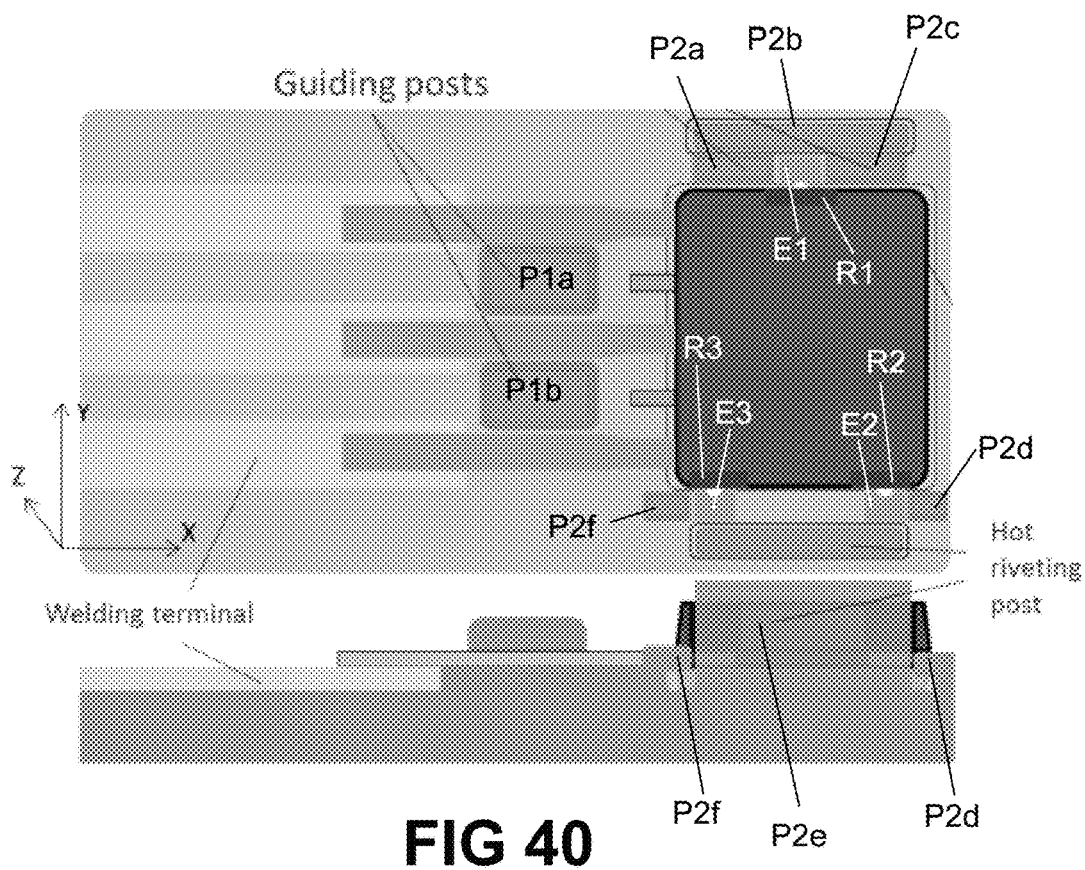

FIG. 40 illustrates yet another component assembly in top view (upper part) and in side view (lower part), before heat staking. This assembly can be seen as a variant of the component assembly of FIG. 38. The support of this example has also only two first posts P1a, P1b, and their height is relatively low, because they are only intended for guiding, for positioning purposes, not for securing purposes. The support has six second posts P2a-P2f, arranged in the vicinity of the lateral protrusions E1-E3 and in the vicinity of the lateral recesses R1-R3. Some of these second posts P2b, P2e are relatively high (higher than the height of the package), because they are intended to be heat staked over the respective recesses R1, R2, R3. The other second posts P2a, P2c, P2d, P2f are relatively low (extending to approximately 50% of the height of the package), because they are intended for guiding purposes only, and are not intended to be deformed. The posts P2a and P2c restrict movement of the ear E1 in the X-direction, the posts P2d and P2f restrict movement of the ears E2 and E3 in the X-direction, the posts P2b and P2e restrict movement of the ears E1-E3 in the Y-direction.

In an alternative embodiment, the second posts P2a, P2b, P2c may form a single integral post, and the second posts P2d, P2e, P2f may form another single integral post.

Figure 41:
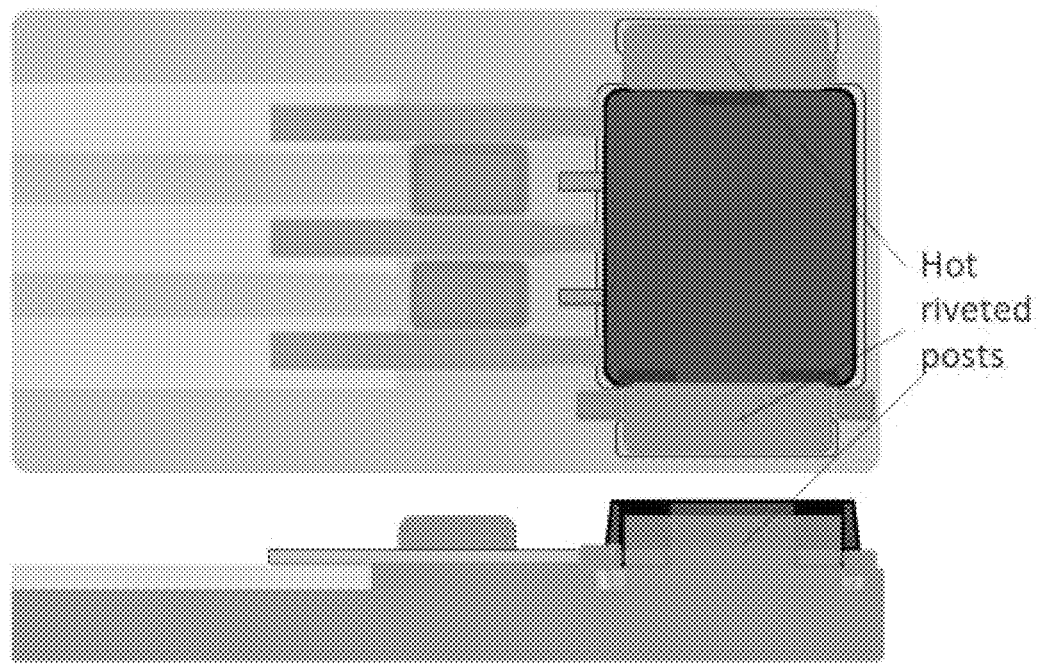

FIG. 41 shows the component assembly of FIG. 40 after heat staking some of the second posts, in the example: P2b and P2e, thereby preventing movement of the package in the Z-direction. These posts are sometimes referred to as "riveting posts". After heating or melting, they at least partially fill the recesses and thereby lock the package to the support. It is an advantage of the supports shown in FIG. 32 to FIG. 41 that the sensor component cannot move in any direction during heat staking.

In the examples of FIG. 36 to FIG. 41, either the first posts or the second posts were heat staked, but not both. In a variant of these embodiments, both the first posts and the second posts are heat staked. Optionally the height of some of the posts needs to be adapted for heat staking. This provides an improved locking, which reduces the risk of the sensor device being moved relatively to the support, e.g. due to vibrations or accelerations.

Figure 42:
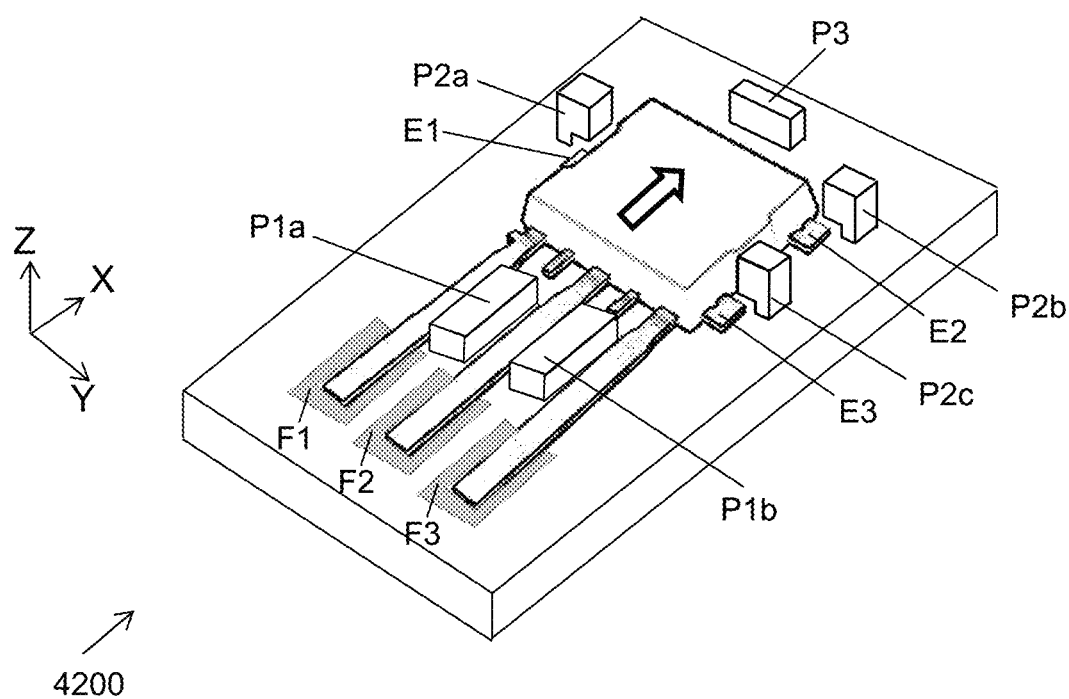

FIG. 42 illustrates another component assembly 4200 according to an embodiment of the present invention, in perspective view. The support comprises two first posts P1a, P1b arranged in the vicinity of the elongated leads, but three or four first posts would also be possible. The support further comprises three second posts, in the form of an inverse L-shape forming a hook, or stated in other words, these second posts have a groove or a cutout for accommodating one or more of the ears. The support further comprises a stop element P3 for limiting movement in the X-direction (during assembly).

In order to mount this sensor component, the sensor component can first be placed on the support as shown in FIG. 42, and then shifted in the X-direction, such that the lateral protrusions move under the second posts, until the component abuts the third post P3. The elongated leads can then be connected to the electrical contacts F1 to F3. In addition, the first posts P1a, P1b, or the second posts P2a to P2c, or the first posts as well as the second posts may additionally be deformed. It is an advantage of this embodiment that movement is the Z-direction is restricted, even if none of the first and second posts is deformed.

Figure 43:
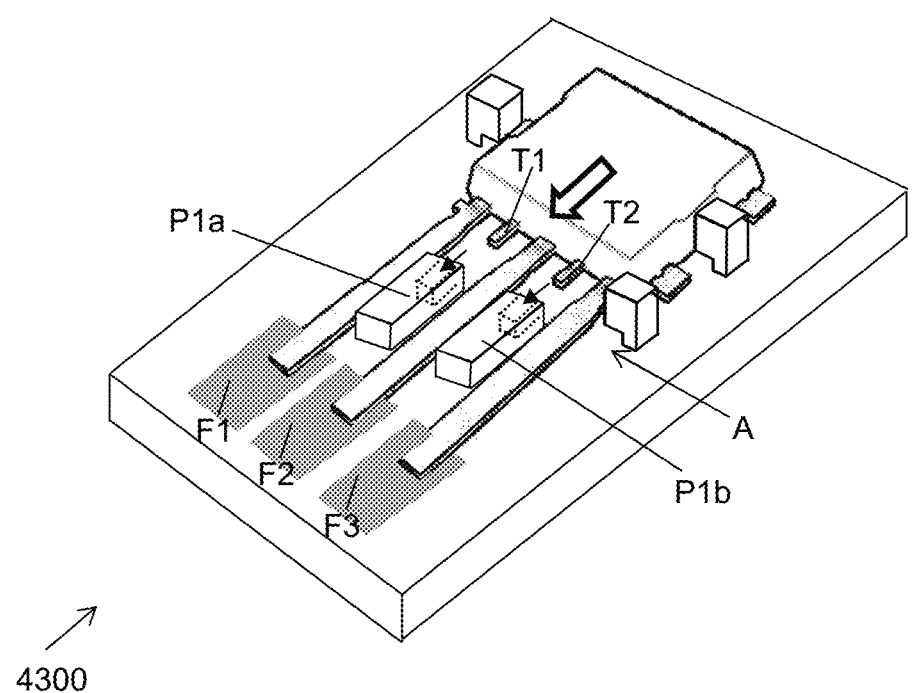

FIG. 43 illustrated another component assembly 4300 according to the present invention, which can be seen as a variant of the component assembly of FIG. 42. In this embodiment, presence of the test pins T1, T2 is required, and the first posts P1a, P1b need to have a cavity for receiving these tabs or test pins. As shown, the support does not require the third post P3.

In order to mount this sensor component, the sensor component can first be placed on the support as shown in FIG. 43, and then shifted in the X-direction, such that the lateral protrusions move under the second posts and such that the tabs or test pins move into the first posts, and the housing abuts the first posts. Of course, it would also be possible to add another second post to limit the movement in the X-direction (e.g. as indicated by arrow A). The elongated leads can then be connected to the electrical contacts F1 to F3. Optionally the first posts may be heat stacked in a manner so as to clamp the test pins T1, T2. It is an advantage of this embodiment that the test pins may also be used for mounting purposes, in particular for securing the sensor component to the support.

It shall be clear to the skilled reader that the embodiments shown in FIG. 36 to FIG. 43 are only examples of assemblies according to the present invention, and that many variants and combinations of first posts and second posts are possible.

Figure 44:
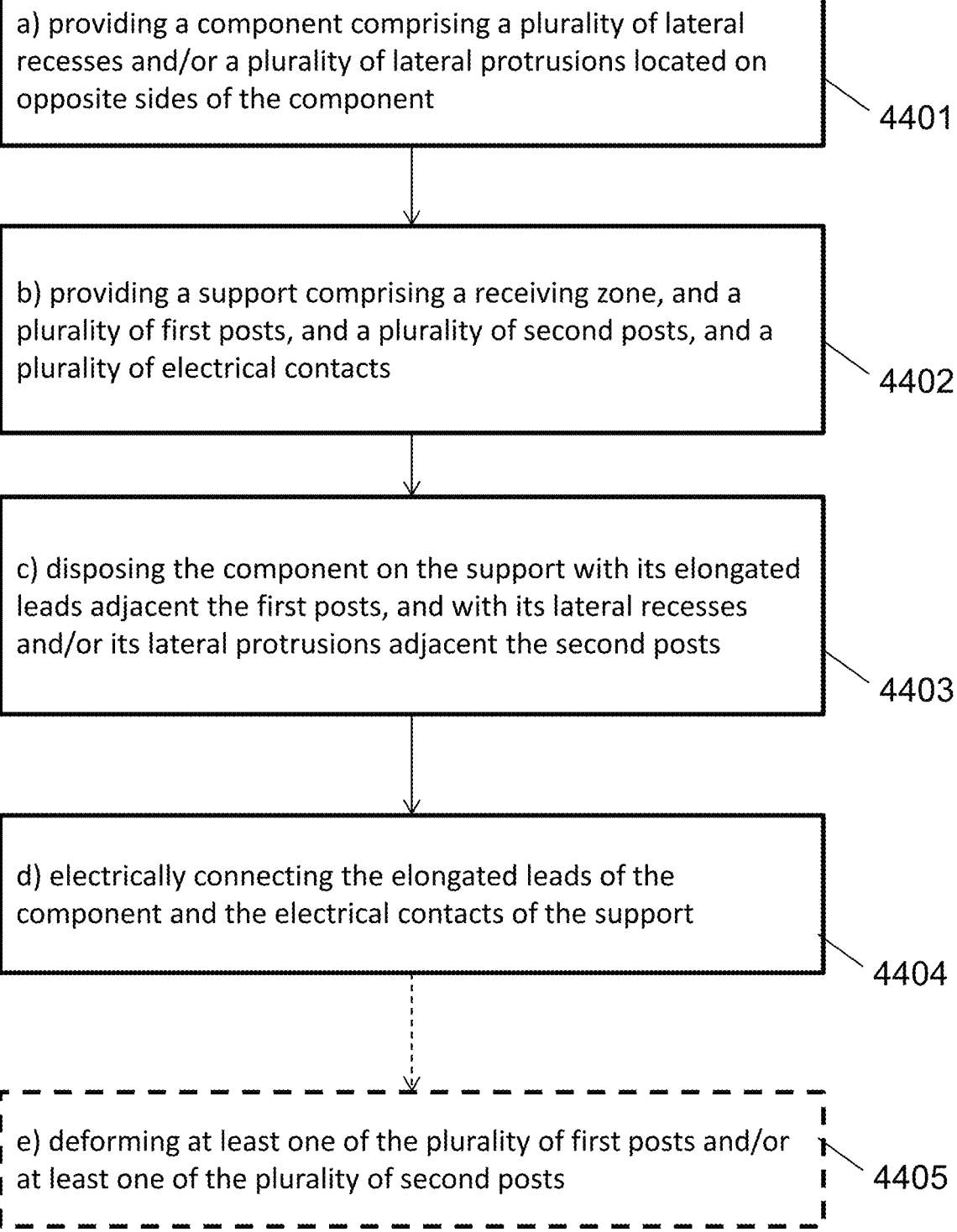

FIG. 44 shows a flow-diagram of a method 4400 of producing a component assembly, according to embodiments of the present invention. The method comprises the following steps:
  a) providing 4401 a sensor component comprising a plurality of at least two (e.g. 2 or 3 or 4) lateral recesses and/or a plurality of at least two (e.g. 2 or 3 or 4) lateral protrusions, said recesses and/or protrusions being located on opposite sides of the component;
  b) providing 4402 a support comprising a receiving zone, and a plurality of at least two first posts, and a plurality of at least two second posts, and a plurality of electrical contacts;
  c) disposing 4403 the sensor component on the support with its electrical leads adjacent the first posts, and with its lateral recesses and/or its lateral protrusions adjacent the second posts;
  d) electrically connecting 4404 the elongated leads of the sensor component to the electrical contacts of the support.

The method may optionally further comprise the step of:
  e) deforming 4405 at least one of the plurality of first posts and/or at least one of the plurality of second posts.

It shall be clear that the order of the steps a) and b) may be reversed, or these steps may be performed in parallel. Likewise, if step e) is present, the order of the steps d) and e) may be reversed, or these steps may be performed in parallel.

Thus, in an embodiment, the plurality of first posts and/or the plurality of second posts are heat staked, so as to assure good alignment and fixation of the sensor component, and thereafter the elongated leads are soldered to the electrical contacts. The soldering does not negatively influence the alignment.

FIG. 45 and FIG. 46 are directed to another aspect of the present invention. This aspect is not related to the recesses, test-pins, lateral protrusion (or ears), or heat staking described above, but is generally related to EMC (electro-magnetic compatibility) behaviour of a packaged semiconductor device. This aspect will be described referring to the same pictures (or slight variants thereof) already explained above, but this part of the present invention is not limited thereto.

The packaged semiconductor device comprises a housing; a sensor circuit provided within the housing; a lead frame that includes a body portion and a plurality of elongated leads, the body portion supporting the sensor circuit, and each of the elongated leads having an interior portion located inside the housing, and an exterior portion that extends from the housing.

One of the elongated leads, referred to as the first lead, (e.g. called GND), is integrally formed with the body portion by means of an interconnection portion. This interconnection portion is preferably relatively narrow (e.g. having a width smaller than the smallest width of the exterior portion of the elongated lead) and relatively long (e.g. having an L/W ratio of at least 4 or at least 5), so as to form a path with increased resistance for high frequency disturbance currents, e.g. RF currents. In other words, the interconnection portion helps to keep the integrated circuit out of the RF current path. This interconnection portion may be formed due to a cut-out of the body-portion (see e.g. FIG. 45), but that is not absolutely required (see e.g. FIG. 46)

The other elongated leads are not integrally formed with the body portion but are connected thereto by means at least one discrete capacitor (e.g. a Surface Mount Discrete capacitor), also incorporated inside the housing. The interior portion of these other leads have a first interior lead portion proximal to the exterior portion, that is relative wide, and have a second interior lead portion, distal from the exterior lead portion, that is relatively long and relatively narrow, so as to form a path with increased resistance for high frequency disturbance currents, e.g. RF currents.

The second interior lead portion may be a projection (or protrusion) of the first interior lead portion. A first end of the at least one capacitor is connected to the body portion (of the lead frame), or to the interconnection portion of the first lead; and a second end of the at least one capacitor is connected to the first (relatively wide) internal lead portion; and a bond wire is connected between a distal end of the second (relatively long and narrow) internal lead portion and a bond pad of the sensor device.

By doing so, a high frequency disturbance current will preferably follow a first RF path formed by the first internal lead portions of the respective leads, through the capacitors (which form a low resistance for high frequency signals), and through the body portion or the intermediate portion of the lead frame, rather than a second RF path formed by the first internal lead portions of the respective leads, through the second (relatively long and narrow) internal lead portions, the bond wires, and some (undefined) path through the sensor circuit.

This is illustrated in FIG. 45($a$), which is drawn to scale, and in an abstract manner in FIG. 45($b$) for the elongated leads EL2 and EL3, wherein:

BP is the body portion of the lead frame that supports the sensor components, typically a two-dimensional area, with a relatively low electrical resistance between any two points thereof;

EL1 is the first elongated lead which is integrally formed with the body portion BP of the lead frame, which is typically used as the ground pin;

IP is the (relatively narrow and relatively long) interconnection portion between the body portion BP of the lead frame and the first elongated lead EL1;

ILP1$a$ is a first internal lead portion of the elongated lead EL2, located proximal to the exterior portion of the lead EL2, and A1 is a position on this first internal lead portion ILP1$a$;

ILP2$a$ is a second internal portion of the elongated lead EL2, located distal to the exterior portion of the lead EL2, and A2 is a distal position on this second internal lead portion ILP2$a$;

ILP1$b$ is a first internal lead portion of the elongated lead EL3, located proximal to the exterior portion of the lead EL3, and B1 is a position on this first internal lead portion ILP1$b$;

ILP2$b$ is a second internal portion of the elongated lead EL3, located distal to the exterior portion of the lead EL3, and B2 is a distal position on this second internal lead portion ILP2$b$;

C1 is a discrete SMD capacitor having one end connected to the first internal lead portion ILP1$a$ of lead EL2, and another end connected to the interconnection portion IP between the body portion BP and first elongated lead EL1;

C2 is a discrete SMD capacitor having one end connected to the first internal lead portion ILP1$b$ of lead EL3, and another end connected to the interconnection portion IP between the body portion BP and first elongated lead EL1;

bw1 is a first bond wire connected between point A1 and a first bond pad (not shown) of the sensor circuit;

bw2 is a second bond wire connected between point B1 and a second bond pad of the sensor circuit.

It is an advantage of connecting the bond wires to the distal ends A2, B2 of the second interior lead portions, because in that way, the bond wires, and thus the integrated circuit can be kept outside of the RF current path.

It is an advantage that the electrical connection points A2 and B2 are not located on the RF current path, i.e. the voltage at these locations is not disturbed.

According to the principles of this aspect of the present invention, a disturbance signal (e.g. in the form of an RF current) applied between the external portions of two elongated leads, will preferably follow a first path through ILP1$a$, C1, IP, C2, ILP1B, rather than a second path through ILP1$a$, ILP2$a$, bw1, the sensor circuit, bw2, ILP2$b$, ILP1$b$. Ideally, the design is to be made in such a way that an RF current applied to any pair of elongated leads (mainly) follows a path that bypasses the sensor device.

FIG. 46 shows a variant of the package shown in FIG. 24($a$), as another example. As mentioned above, the presence of the recesses, lateral protrusions, and test pins, is not relevant for this aspect of the present invention, and hence are omitted from FIG. 46, in order to simplify the drawings.

FIG. 46($a$) is a realistic drawing, which is drawn to scale, FIG. 46($b$) and FIG. 46($c$) are abstract drawings. As can be seen, EL1 is the first lead which is integrally formed with the body portion of the lead frame. EL2 and EL3 are the other elongated leads.

FIG. 46($b$) shows that the lead EL2 of FIG. 46($a$) has a first internal portion ILP1$a$ which is connected via two capacitors C1, C1' with a body portion of the lead frame, and shows that the first lead portion ILP1$a$ of EL2 is further connected to a second lead portion ILP2$a$ which is relatively long and relatively narrow, and that a distal end A1 of this second internal lead portion ILP2$a$ is connected to the sensor circuit via a bond wire bw1.

FIG. 46($c$) shows that the lead EL3 of FIG. 46($a$) has a first internal portion ILP1$b$ which is connected via a capacitor C2 with the first internal portion of the first lead EL1, and shows that the first lead portion ILP1$b$ of EL3 is further connected to a second lead portion ILP2$b$ which is relatively long and relatively narrow, and that a distal end B1 of this second internal lead portion ILP2$b$ is connected to the sensor circuit via a bond wire bw2.

The skilled person will understand that FIG. 45 and FIG. 46 are merely intended to illustrate the principles of this aspect of the present invention, and that the present invention is not limited to these specific embodiments. For example, the same principles can also be applied to a package having more than three elongated leads, and also to packages comprising integrated circuits which are not sensor circuits. Of course, the features described in relation to FIG. 45 and/or FIG. 46 can be combined with any of the embodiments described above.

As is understood by those skilled in the art, the terms "over", "under", "above", "below", "beneath", and "on" are relative terms and can be interchanged in reference to different orientations of the layers, elements, and substrates included in the present invention. For example, a first layer, element, or structure on a second layer, element, or structure in some embodiments means a first layer, element, or structure directly on and in contact with a second layer, element, or structure. In other embodiments, a first layer, element, or element on a second layer, element, or structure can include another layer there between. Additionally, "on" can mean "on" or "in" or "in contact with" or "directly on."

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus, and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. A sensor, comprising:
a housing;
a lead frame comprising at least three elongated leads having an exterior portion extending from the housing;
at least one magnetic sensor circuit disposed in the housing, and connected to the lead frame;
the housing comprising at least two lateral recesses arranged on two opposite sides of the housing and/or at least two lateral protrusions arranged on two opposite sides of the housing, for allowing the sensor to be mounted by heat-stacking,
wherein the sensor comprises a first lateral side, and a second lateral side opposite the first lateral side; and
wherein the sensor comprises at least three lateral recesses, including a first, a second and a third lateral recess; and
wherein the sensor comprises at least three lateral protrusions, including a first, a second and a third lateral protrusion; and
wherein the first lateral recess and the first lateral protrusion are arranged substantially in the middle of the first lateral side; and
wherein the second lateral recess and the second lateral protrusion are arranged near a first end of the second lateral side; and
wherein the third lateral recess and the third lateral protrusion are arranged near a second end of the second lateral side, opposite the first end.

2. The sensor of claim 1,
wherein the sensor comprises the at least two lateral recesses and an equal amount of lateral protrusions, each one of said lateral protrusions being aligned with a corresponding one of said recesses.

3. A sensor, comprising:
a housing;
a lead frame comprising at least three elongated leads having an exterior portion extending from the housing;
at least one magnetic sensor circuit disposed in the housing, and connected to the lead frame;
the housing comprising at least two lateral recesses arranged on two opposite sides of the housing and/or at least two lateral protrusions arranged on two opposite sides of the housing, for allowing the sensor to be mounted by heat-stacking,
wherein the sensor further comprises a second magnetic sensor circuit; and
wherein the sensor comprises at least four elongated leads having an exterior portion extending from the housing; and
wherein the first magnetic sensor circuit is electrically connected to a first subset of said at least four elongated leads, and wherein the second magnetic sensor circuit is electrically connected to a second subset of said at least four elongated leads, the second subset being different from the first subset.

4. The sensor of claim 3, wherein the first magnetic sensor circuit comprises a first magnetic sensor, and the second magnetic sensor circuit comprises a second magnetic sensor; and
wherein the second magnetic sensor circuit is arranged above or on top of the first magnetic sensor circuit, and is rotated with respect to the first magnetic sensor circuit such that a position of the first magnetic sensor substantially coincides with a position of the second magnetic sensor circuit.

5. A sensor, comprising:
a housing;
a lead frame comprising at least three elongated leads having an exterior portion extending from the housing;
at least one magnetic sensor circuit disposed in the housing, and connected to the lead frame;
the housing comprising at least two lateral recesses arranged on two opposite sides of the housing and/or at least two lateral protrusions arranged on two opposite sides of the housing, for allowing the sensor to be mounted by heat-stacking,
wherein the lead frame contains a first portion supporting the magnetic sensor circuit; and
wherein one of said at least three elongated leads is integrally formed with the first portion of the lead frame; and
wherein the lead frame is shaped such that the exterior portion of this one lead is connected to the first portion of the lead frame by means of an interconnection portion having a width smaller than a width of the exterior portion of this one lead.

6. The sensor of claim 5, wherein the interconnection portion and an internal portion of said one lead form an L-shape or a T-shape.

7. The sensor of claim 5, wherein the other elongated leads of the at least three elongated leads are each connected to said first portion of the lead frame by means of at least one discrete passive component.

8. A component assembly, comprising:
   a sensor that includes
      a housing,
      a lead frame comprising at least three elongated leads having an exterior portion extending from the housing,
      at least one magnetic sensor circuit disposed in the housing, and connected to the lead frame,
      the housing comprising at least two lateral recesses arranged on two opposite sides of the housing and/or at least two lateral protrusions arranged on two opposite sides of the housing, for allowing the sensor to be mounted by heat-stacking;
   the component assembly further comprising a support having a receiving zone, and a plurality of at least two first posts, and a plurality of electrical contacts; and
   wherein the sensor is disposed on or over the support within the receiving zone such that at least one of the elongated leads is arranged adjacent one or more of the first posts; and
   wherein the elongated leads are electrically connected to the electrical connections of the support.

9. The component assembly of claim 8, wherein at least one of the second posts has a U-shaped cross-section for accommodating at least one of the lateral protrusions.

10. The component assembly of claim 8, wherein at least one of the plurality of first posts is deformed so as to clamp at least one of the elongated leads and/or at least one of the tabs of the sensor to the support.

11. The component assembly of claim 8, wherein at least one of the plurality of second posts is deformed so as to clamp the sensor to the support by means of at least one of its lateral recesses and/or by means of at least one of its lateral protrusions.

12. A method of producing the component assembly of claim 8, the method comprising the steps of:
   a) providing the sensor;
   b) providing a support comprising a receiving zone, and a plurality of first posts, and a plurality of electrical contacts;
   c) disposing the sensor on the support with at least one of its elongated leads adjacent at least one of the first posts;
   d) electrically connecting the elongated leads of the sensor and the electrical contacts of the support.

13. The method of claim 12, wherein step b) comprises: providing a support comprising a receiving zone, and a plurality of first posts, and a plurality of second posts, and a plurality of electrical contacts; and
   wherein step c) comprises: c) disposing the sensor on the support with at least one of its elongated leads adjacent at least one of the first posts, and with at least one of its lateral recesses and/or at least one of its lateral protrusions adjacent at least one of the second posts.

14. The method of claim 12, further comprising the step of:
   e) deforming at least one of the first posts and/or at least one of the second posts, e.g. by heat-staking.

15. A sensor, comprising:
   a housing;
   a lead frame comprising at least three elongated leads, each having a respective exterior portion extending from the housing;
   a magnetic sensor circuit disposed in the housing, and connected to the lead frame;
   wherein the lead frame contains a first portion supporting the magnetic sensor circuit; and
   wherein one of said at least three elongated leads is integrally formed with the first portion of the lead frame;
   wherein the lead frame is shaped such that the exterior portion of this one lead is connected to the first portion of the lead frame by means of an interconnection portion; and
   wherein the other elongated leads of the at least three elongated leads are each connected to said first portion of the lead frame by means of at least one discrete passive component.

16. The sensor of claim 15, wherein the interconnection portion and an internal portion of said one lead form an L-shape or a T-shape.

17. A sensor, comprising:
   a housing;
   a lead frame comprising at least three elongated leads, each having a respective exterior portion extending from the housing;
   a magnetic sensor circuit disposed in the housing, and connected to the lead frame;
   wherein the lead frame contains a first portion supporting the magnetic sensor circuit; and
   wherein one of said at least three elongated leads is integrally formed with the first portion of the lead frame;
   wherein the lead frame is shaped such that the exterior portion of this one lead is connected to the first portion of the lead frame by means of an interconnection portion;
   wherein the sensor further comprises a second magnetic sensor circuit; and
   wherein the sensor comprises at least four elongated leads having an exterior portion extending from the housing; and
   wherein the first magnetic sensor circuit is electrically connected to a first subset of said at least four elongated leads, and wherein the second magnetic sensor circuit is electrically connected to a second subset of said at least four elongated leads, the second subset being different from the first subset.

18. The sensor of claim 17, wherein the first magnetic sensor circuit comprises a first magnetic sensor, and the second magnetic sensor circuit comprises a second magnetic sensor; and
   wherein the second magnetic sensor circuit is arranged above or on top of the first magnetic sensor circuit, and is rotated with respect to the first magnetic sensor circuit such that a position of the first magnetic sensor substantially coincides with a position of the second magnetic sensor circuit.

* * * * *